US009393590B2

(12) United States Patent
Neretina et al.

(10) Patent No.: US 9,393,590 B2
(45) Date of Patent: Jul. 19, 2016

(54) SELF-ASSEMBLY OF SMALL STRUCTURES

(71) Applicant: Temple University—Of the Commonwealth System of Higher Education, Philadelphia, PA (US)

(72) Inventors: Svetlana Neretina, Bala Cynwyd, PA (US); Robert Alan Hughes, Bala Cynwyd, PA (US); Pouyan Farzinpour, Philadelphia, PA (US)

(73) Assignee: TEMPLE UNIVERSITY—OF THE COMMONWEALTH SYSTEM OF HIGHER EDUCATION, Philadelphia, PA (US)

( * ) Notice: Subject to any disclaimer, the term of this patent is extended or adjusted under 35 U.S.C. 154(b) by 604 days.

(21) Appl. No.: 13/862,579

(22) Filed: Apr. 15, 2013

(65) Prior Publication Data

US 2013/0273340 A1   Oct. 17, 2013

Related U.S. Application Data

(60) Provisional application No. 61/624,799, filed on Apr. 16, 2012.

(51) Int. Cl.

| | |
|---|---|
| *B05D 1/32* | (2006.01) |
| *B82B 3/00* | (2006.01) |
| *B81C 1/00* | (2006.01) |
| *B82Y 10/00* | (2011.01) |
| *B82Y 30/00* | (2011.01) |
| *B82Y 40/00* | (2011.01) |
| *H01L 29/66* | (2006.01) |
| *H01L 29/06* | (2006.01) |
| *H01L 29/16* | (2006.01) |

(52) U.S. Cl.
CPC .............. *B05D 1/32* (2013.01); *B81C 1/00031* (2013.01); *B82B 3/0014* (2013.01); *B82Y 10/00* (2013.01); *B82Y 30/00* (2013.01); *B82Y 40/00* (2013.01); *H01L 29/0676* (2013.01); *H01L 29/1606* (2013.01); *H01L 29/66439* (2013.01); *H01L 29/66469* (2013.01); *Y10T 428/24942* (2015.01)

(58) Field of Classification Search
None
See application file for complete search history.

(56) References Cited

U.S. PATENT DOCUMENTS

| | | |
|---|---|---|
| 4,721,689 A | 1/1988 | Chaloux, Jr. et al. |
| 6,774,003 B2 | 8/2004 | Tavkhelidze et al. |
| 7,524,746 B2 | 4/2009 | Locascio et al. |

(Continued)

FOREIGN PATENT DOCUMENTS

WO    2010/054891 A1    5/2010

OTHER PUBLICATIONS

M. R. Jones, K. D. Osberg, R. J. Macfarlane, M. R. Langille, C. A. Mirkin, Templated techniques for the synthesis and assembly of plasmonic nanostructures, Chem. Rev. 111, 3736-3827 (2011).

(Continued)

*Primary Examiner* — Michael P Rodriguez
(74) *Attorney, Agent, or Firm* — Drinker Biddle & Reath LLP

(57) ABSTRACT

Small structures are formed by applying to a substrate a structural material and a layer of a sacrificial material having a lower surface energy than the structural material, to form an intermediate product. The substrate is then heated to a temperature at which the sacrificial material evaporates or sublimes and the structural material is mobilized. The sacrificial material is permitted to evaporate or sublime, an area of the substrate covered by the sacrificial material to diminish, and the structural material to agglomerate on the remaining sacrificial material to form a structure.

10 Claims, 29 Drawing Sheets

(56) References Cited

U.S. PATENT DOCUMENTS

| | | | |
|---|---|---|---|
| 7,560,394 | B2 | 7/2009 | Park et al. |
| 7,714,421 | B2 | 5/2010 | Kim et al. |
| 7,736,414 | B1 | 6/2010 | Zinn |
| 2006/0266442 | A1 | 11/2006 | Narayan et al. |
| 2007/0054502 | A1 | 3/2007 | Seol et al. |
| 2007/0092983 | A1 | 4/2007 | Weigold |
| 2008/0081391 | A1 | 4/2008 | Martin et al. |
| 2009/0020924 | A1* | 1/2009 | Lin ............... B82Y 30/00 264/605 |
| 2010/0285279 | A1 | 11/2010 | Doyle et al. |

OTHER PUBLICATIONS

Thompson C. V., Solid-state dewetting of thin films, Ann. Rev. Mater. Res., 42, 399-434 (2012).

A. Sundar, R. A. Hughes, P. Farzinpour, S. Neretina, G. A. Devenyi, J. S. Preston, Manipulating the size distribution of supported gold nanostructures, Appl. Phys. Lett. 100, 013111 (2012).

E. Dornel, J. C. Barbe, F. de Crecy, G. Lacolle and J. Eymery, Phys. Rev. B: Condens. Matter Mater. Phys., 2006, 73, 115427.

C. M. Müller, F. C. F. Mornaghini, R. Spolenak, Ordered arrays of faceted gold nanoparticles obtained by dewetting and nanosphere lithography, Nanotechnology 19, 485306 (2008).

P. Farzinpour, A. Sundar, K. D. Gilroy, Z. E. Eskin, R. A. Hughes, S. Neretina, Dynamic Templating: A Large Area Processing Route for the Assembly of Periodic Arrays of Sub-Micrometer and Nanoscale Structures Nanoscale, 5, 1929-1938 (2013).

P. Farzinpour, A. Sundar, K. D. Gilroy, Z. E. Eskin, R. A. Hughes, S. Neretina, Altering the dewetting characteristics of ultrathin gold and silver films using a sacrificial antimony layer, Nanotechnology 23, 495604 (2012).

T. P. Bigioni, X.-M. Lin, T. T. Nguyen, E. I. Corwin, T. A. Witten, H. M. Jaeger, Kinetically driven self assembly of highly ordered nanoparticle monolayers, Nat. Mater. 5, 265-270 (2006).

S. Biswas, S. Gawande, V. Bromberg, Effects of particle size and surface properties on deposition dynamics of inkjet-printed colloidal drops for printable photovoltaics fabrication, J. Solar Eng. 132, 021010 (2010).

* cited by examiner

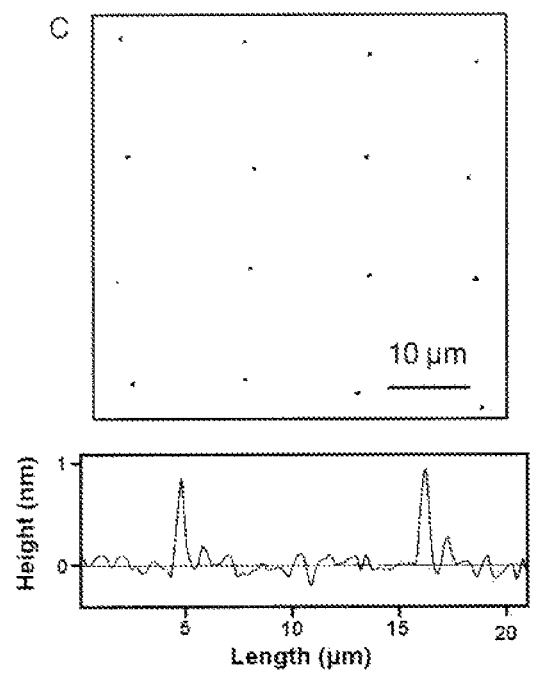
FIG. 7C
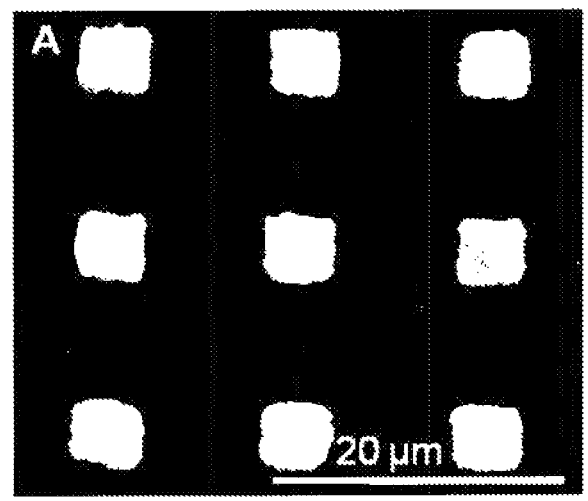
FIG. 8A    550 °C

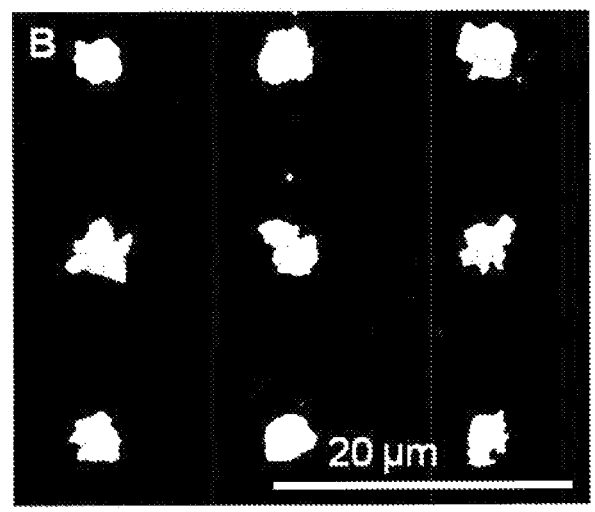
FIG. 8B    600 °C
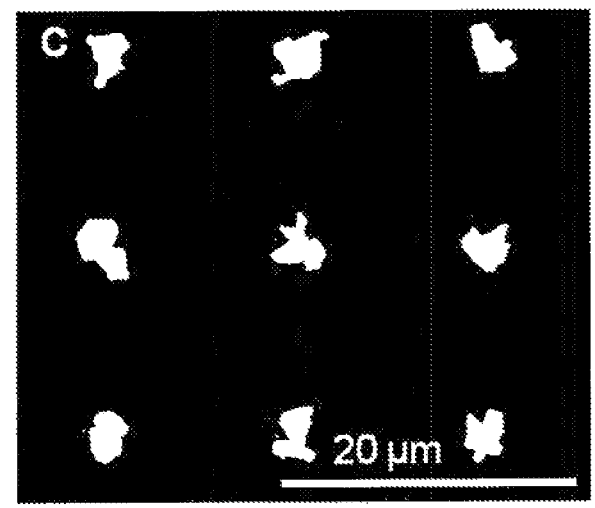
FIG. 8C    605 °C
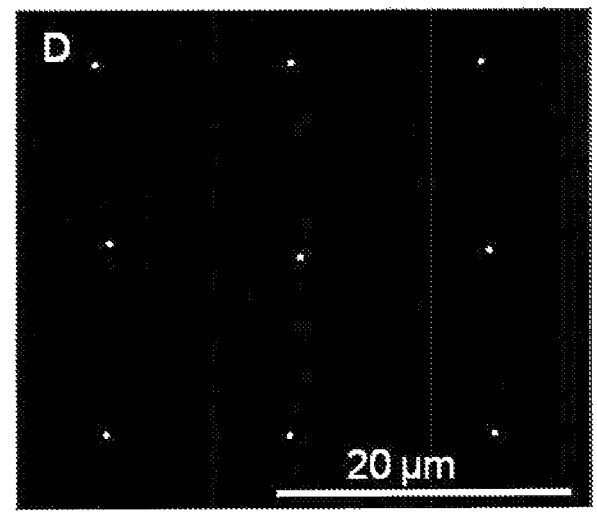
FIG. 8D    615 °C

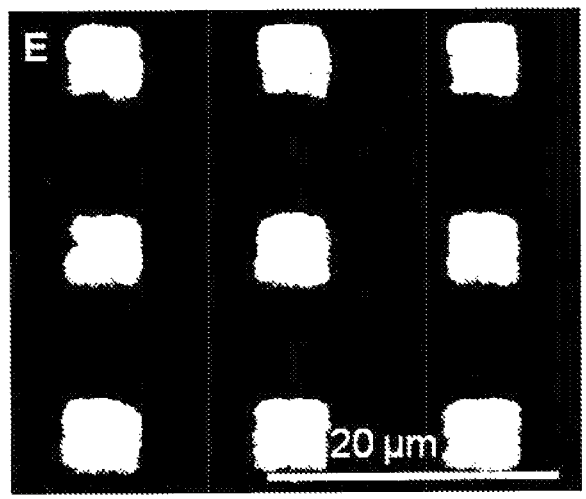
FIG. 8E    550 °C
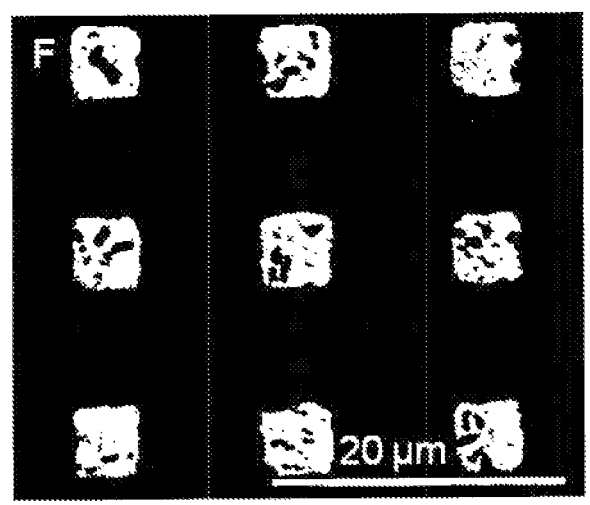
FIG. 8F    600 °C
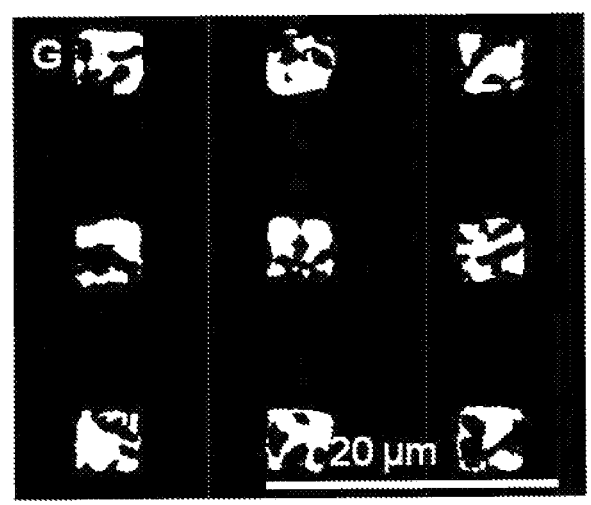
FIG. 8G    605 °C

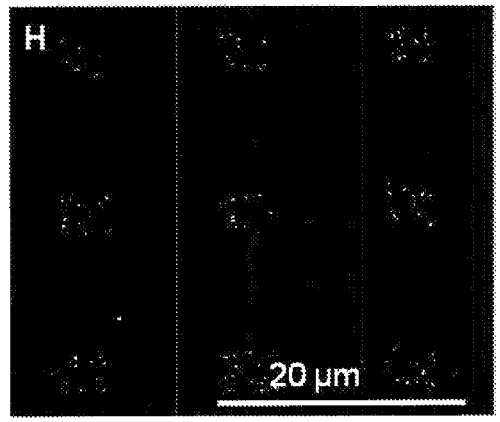
FIG. 8H  615 °C
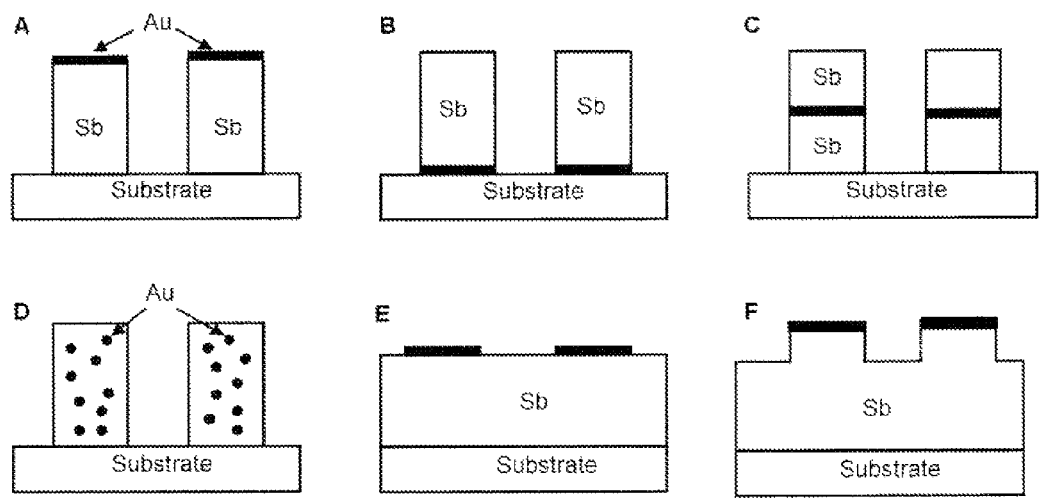
FIG. 9

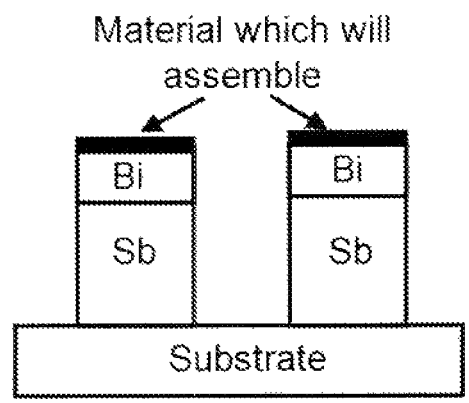
FIG. 10
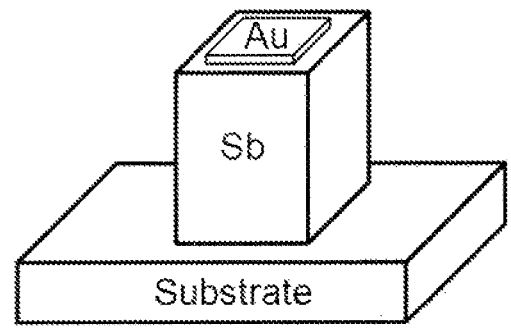
FIG. 11
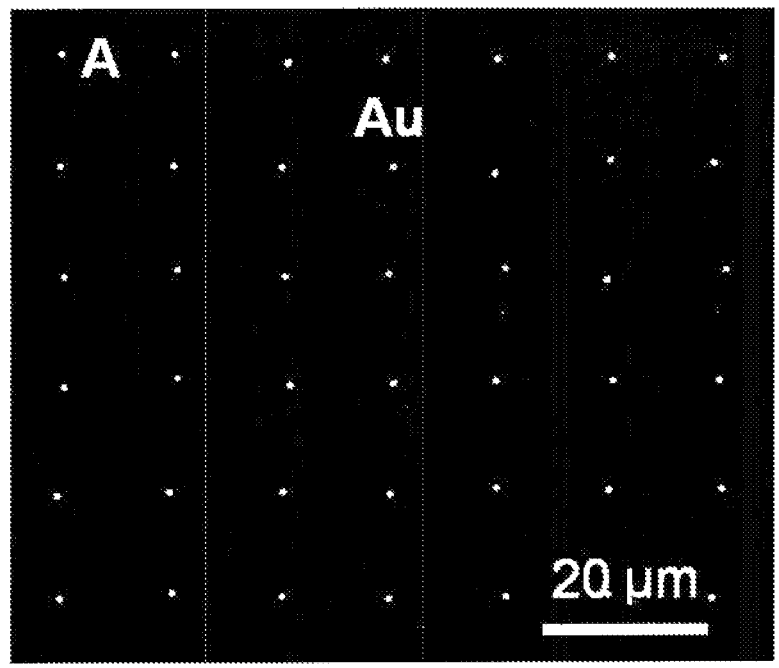
FIG. 12A    Au

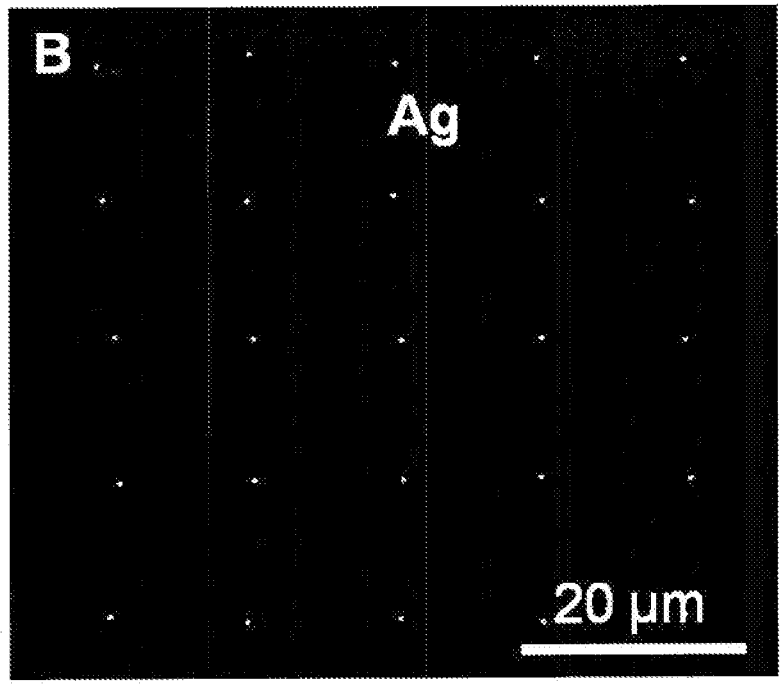
FIG. 12B    Ag
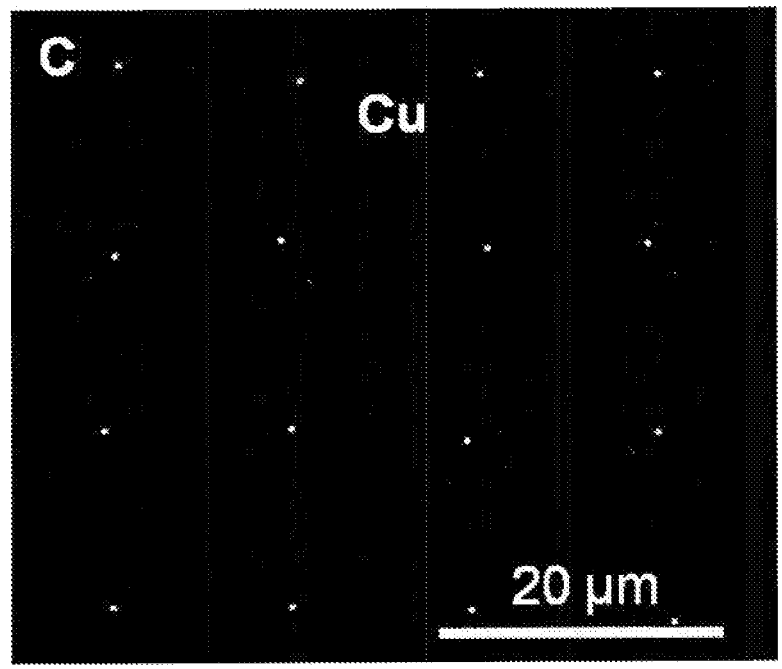
FIG. 12C    Cu

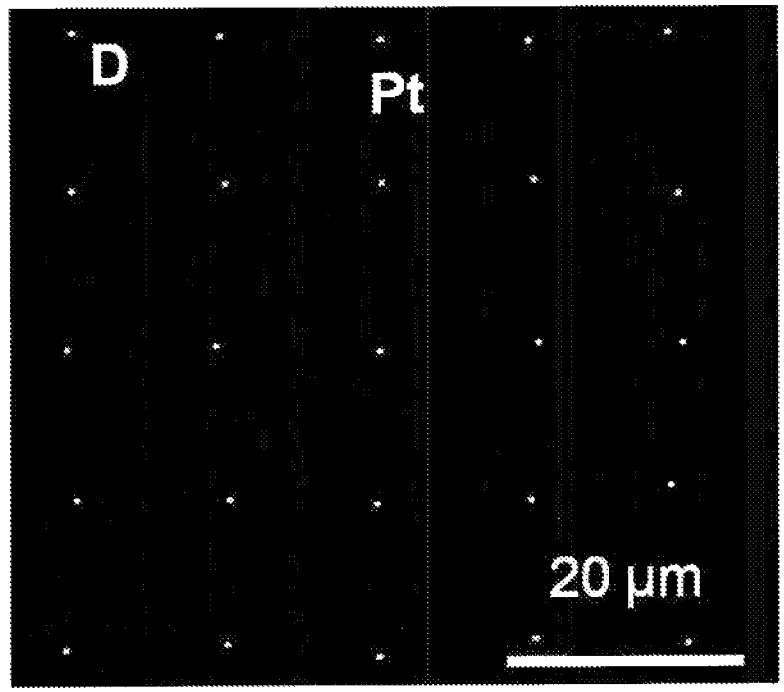
FIG. 12D  Pt
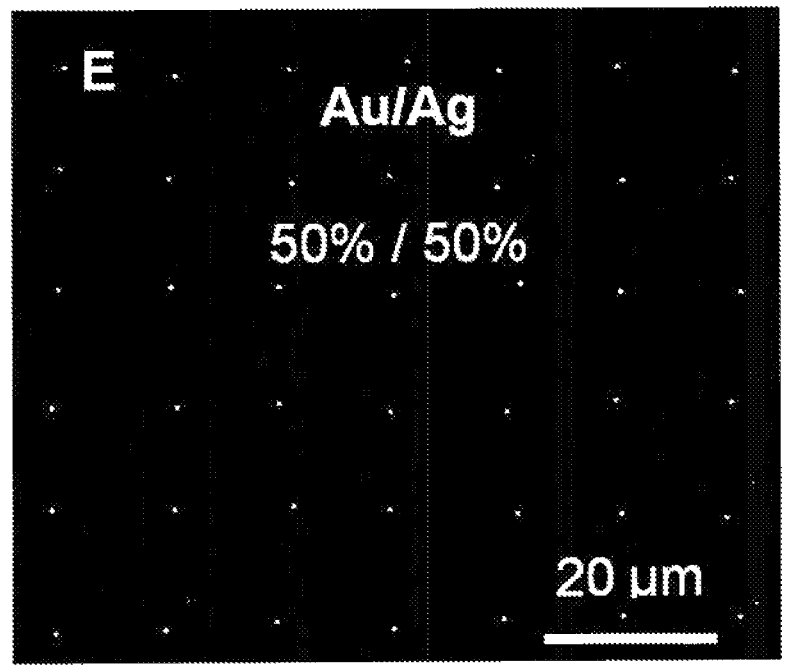
FIG. 12E  Au/Ag

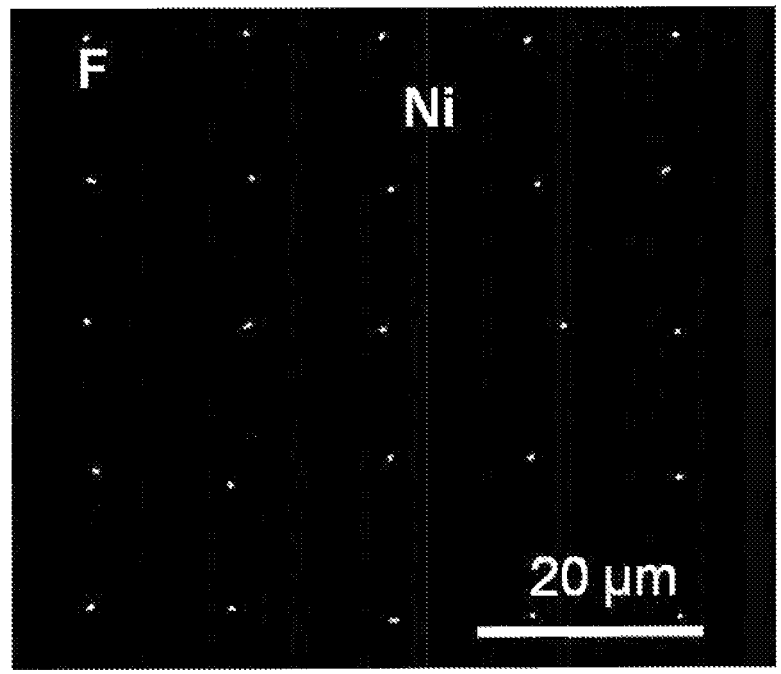
FIG. 12F    Ni
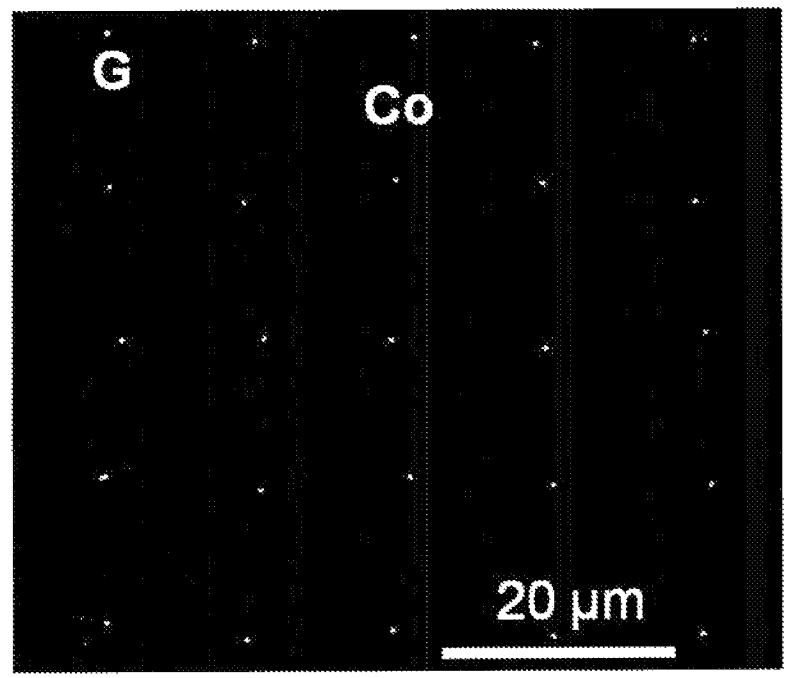
FIG. 12G    Co

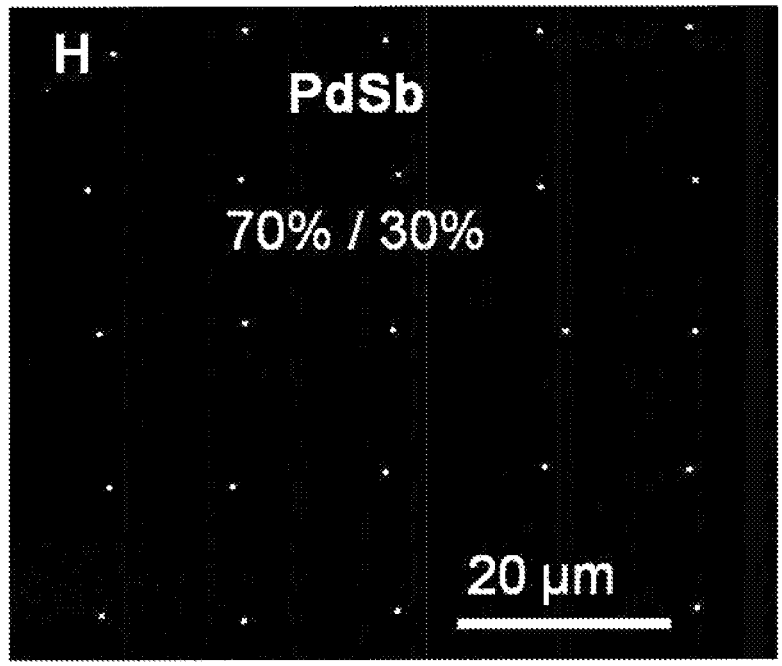
FIG. 12H    Pd/Sb
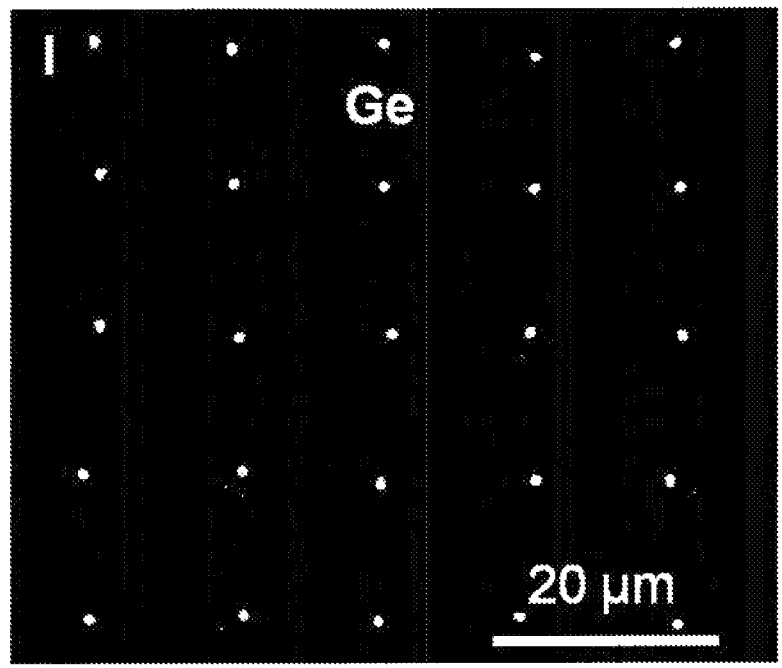
FIG. 12I    Ge

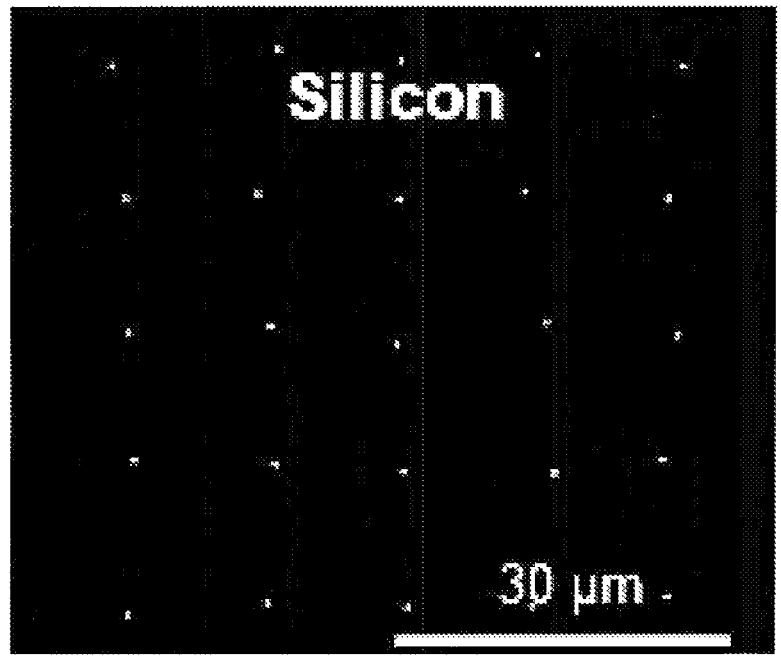
FIG. 13A    Si
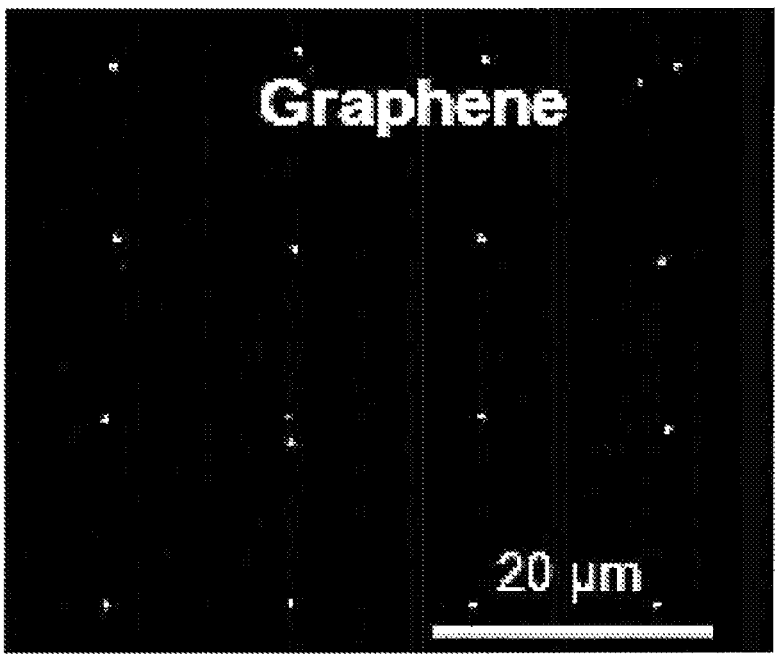
FIG. 13B    Graphene

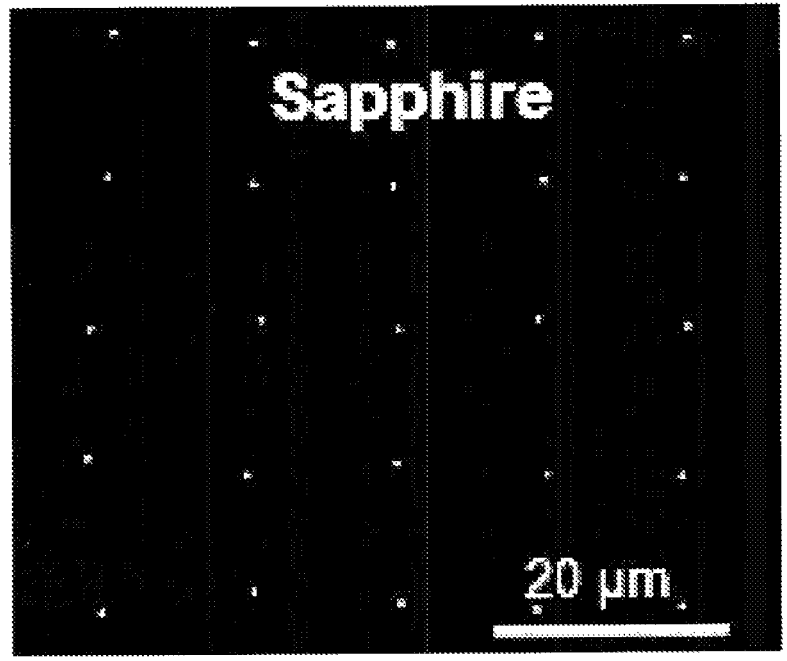
FIG. 13C  Sapphire
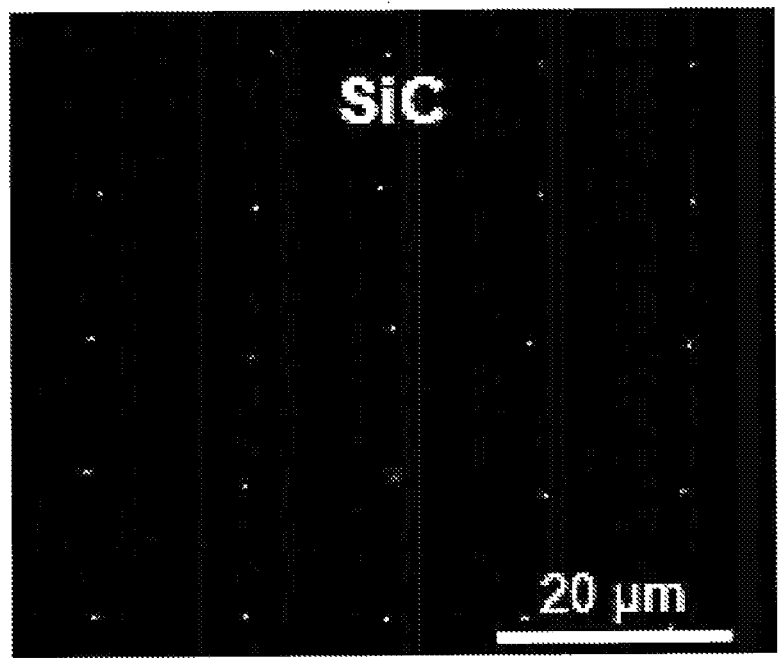
FIG. 13D  SiC

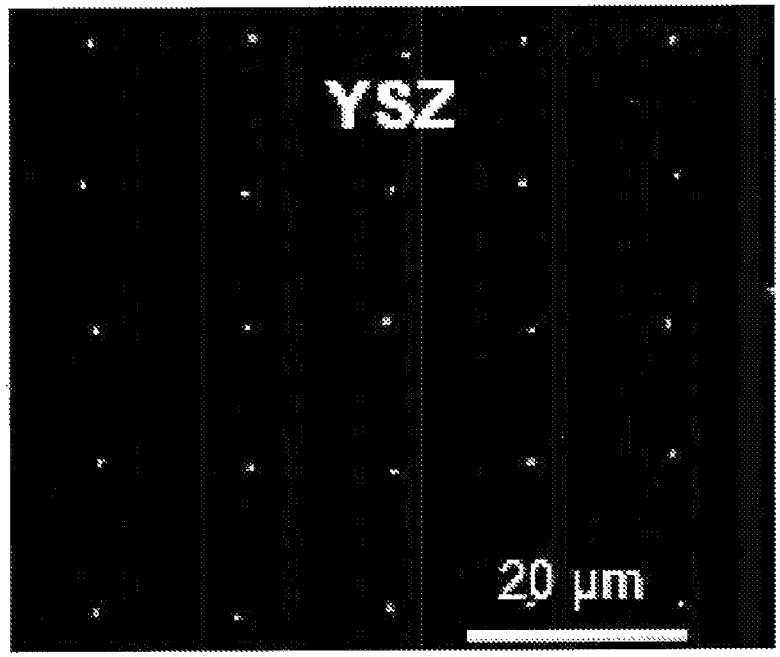
FIG. 13E    YSZ
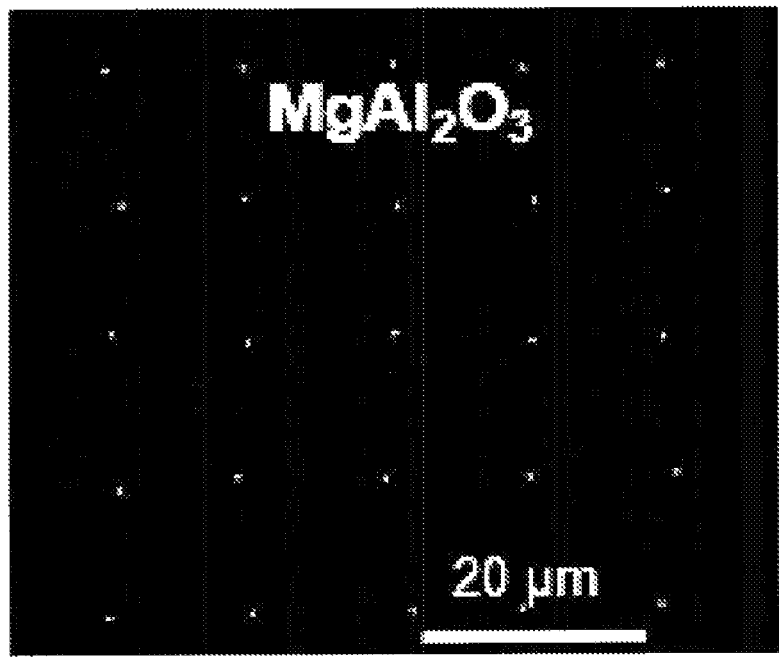
FIG. 13F    MgAl₂O₃

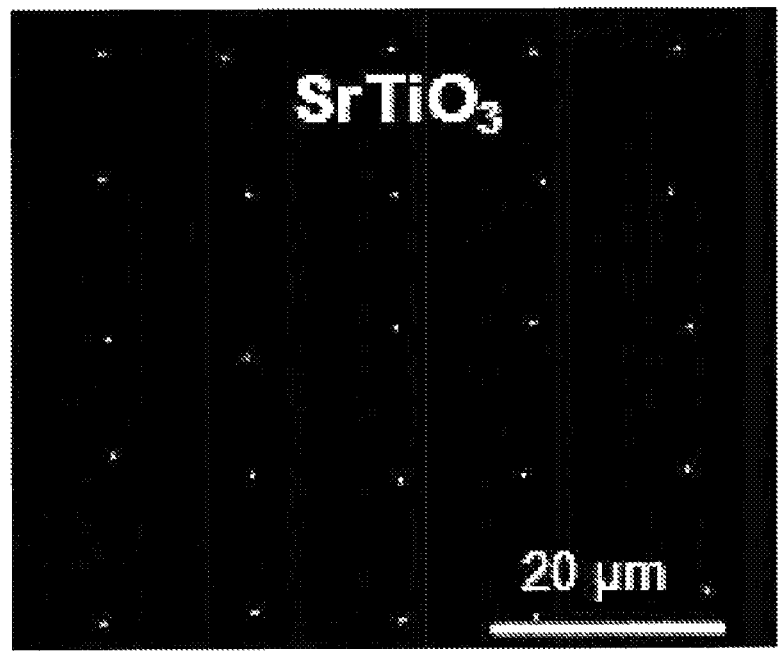
FIG. 13G    SrTiO₃
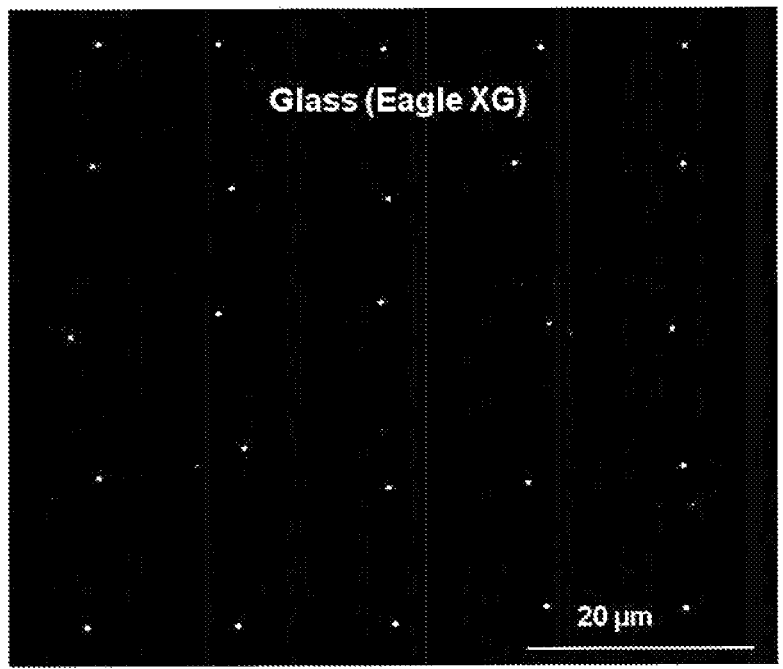
FIG. 13H    Glass (Eagle XG)

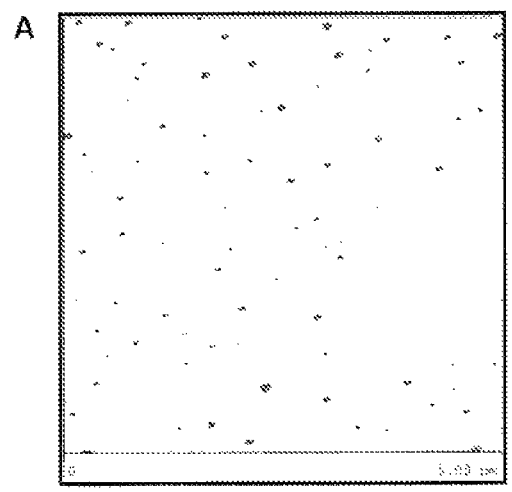
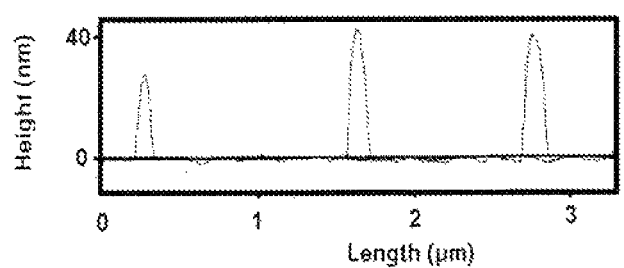
FIG. 22A
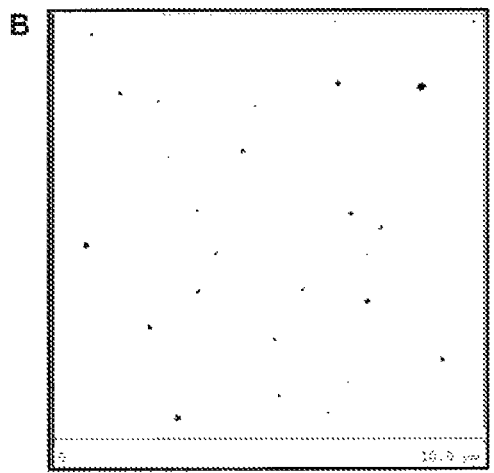
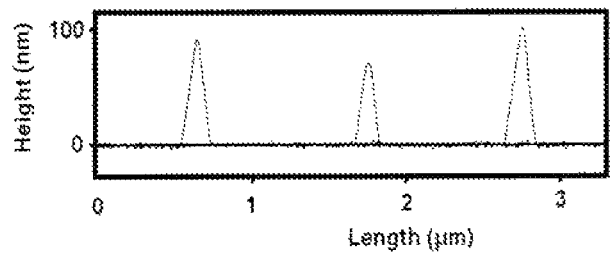
FIG. 22B

SELF-ASSEMBLY OF SMALL STRUCTURES

BACKGROUND OF THE INVENTION

The invention relates to the formation of structures, and especially to the formation of sub-micrometer-scale or nanometer-scale structures by forming a layer of material and then concentrating that layer into a smaller area. The invention also relates to the self-assembly of sub-micrometer and nanometer length-scale substrate-based structures. The "structures" formed may be as simple as round, usually hemispherical or near hemispherical, micro- or nanoparticles on a substrate. They may also be highly faceted.

The rapid advances in solid state electronics over the last forty years are founded on the fabrication of wafer-based materials and interfaces with well-defined properties situated at well-defined locations where, over time, the density of structures has steadily increased as their dimensions have steadily decreased. This triumph of science and engineering is now being challenged by nanometer length-scales and quantum confinement effects. Establishing the ability to place arbitrarily small immobilized nanostructures on a substrate at predefined locations in a cost-effective manner is one of the grand challenges facing nanotechnology researchers. Addressing this unmet need would be transformative in that it would provide the enabling processing route required to advance new technologies based on electronic, optical and magnetic finite-size effects.

The two dominant techniques for forming patterned materials on sub-micrometer length-scales are photolithography and electron-beam lithography. These techniques are cost-prohibitive and face huge technical hurdles when creating patterns on length-scales less than 50 nm. An assortment of advanced lithographic techniques which are adaptations of these techniques are being implemented in an effort to overcome these limitations. Included among these techniques are 193 nm immersion lithography[1], extreme ultraviolet lithography[2], interference lithography and step and flash imprint lithography[4]. Associated with those techniques are technological and economic barriers which limit them to the most sophisticated fabrication facilities. One response to those technically demanding cost-prohibitive routes has been the development of a multitude of unconventional lithographic techniques focused on low temperature processing routes for the formation of patterned photoresist materials[5-9]. While far less cost-prohibitive, each of these routes faces its own distinctive technological hurdles. For all of the aforementioned techniques, defining nanostructures on sub-50 nm length-scales is proving difficult[10].

In contrast, self-assembly processes have been quite effective in achieving the sizes required for the formation of substrate-supported nanostructures, but the accurate placement of self-assembled nanostructures has proved exceedingly difficult[10-16].

Thin film and nanostructure formation on substrate surfaces is driven by thermodynamics and kinetics. While thermodynamics always drives the system towards the most energetically favorable state, atom kinetics often prevent this state from being reached. This is a simple consequence of the fact that atoms often encounter energy barriers that they have insufficient kinetic energy to overcome, a circumstance which confines the system to a metastable state. A continuous ultra-thin metal film deposited on a substrate at room temperature exists in such a metastable state if the surface energy of the metal is greater than that of the substrate material. Thermodynamics drives such a system towards a geometry which reduces the surface area of the metal. This geometry, however, is unattainable because the metal atoms lack the kinetic energy required to move significant distances across the surface. The net result is a continuous metastable film "frozen in place".

Heating such a film allows it to move towards the equilibrium state, which sees it agglomerate into metal nanostructures at temperatures well below the melting point of the metal. This process, commonly referred to as dewetting, is typically initiated at grain boundary defects which give rise to holes that extend through the film to the substrate surface[17]. Agglomeration then proceeds through solid state surface diffusion away from these step edges. The process is quite complex with Rayleigh instabilities[18], fingering instabilities[19], grain boundaries[20] and substrate surface texture[18] all playing a decisive role. In general, thinner films dewet at lower temperatures forming nanostructures which are smaller and more densely packed[21]. The nanostructures formed are usually well-bonded to the substrate, having a contact angle determined by surface energy considerations (i.e. Young's equation[22]). The structure formed is also influenced by the crystallographic orientation of the substrate[13] and film[23], the lattice mismatch between the substrate and metal[13], substrate surface reconstructions[24], nanostructure faceting[25] and interface chemistry[26]. When left at elevated temperatures for extended periods of time, the nanostructures are also subject to Ostwald ripening, which sees a disproportionate exchange of atoms between the nanostructures via surface diffusion that favors larger structures at the expense of smaller ones[27,28].

The deposition of a high surface energy thin film on a low surface energy substrate, followed by its subsequent dewetting and agglomeration into droplets at elevated temperatures, has been used as a method for obtaining substrate-based nanostructures. This dewetting procedure typically occurs in the solid state at temperatures well below the melting point of the film material. The mechanisms governing this dewetting phenomenon, however, are quite complex and are influenced by the film thickness[21], the crystallographic orientation of the substrate[13] and film[23], substrate surface reconstructions[24], the substrate-film lattice mismatch[13], faceting[25] and interface chemistry[26]. This multitude of factors leads to limited control over and a randomness in the nanoparticle size distribution, spacing and placement.

One approach relies on the fabrication of a substrate with a periodic surface texture over which a continuous metal film is deposited[17,29,30,63]. At elevated temperatures the textured areas with the highest curvature create film weak points at well-defined locations that activate the dewetting phenomenon. While arrays of metal structures have been produced in this manner, the highly textured nature of the surface creates numerous challenges if these structures are to be incorporated into device architectures. Recently, we demonstrated that gold nanostructures can be sculpted from larger sub-micrometer structures produced via thermal dewetting[31]. The work demonstrated that capillary bridges formed between substrate immobilized gold structures and a metal foil resulted in a surface energy gradient able to drive gold diffusion towards the foil. Using this technique, periodic arrays of gold particles were reduced in size from 350 nm to a mere 21 nm. This technique, while successful, lacks the control required to sculpt nanostructures with predefined sizes.

The dewetting phenomenon is, by far, the simplest and most cost-effective approach for obtaining substrate-supported nanostructures. There are, however, a number of important disadvantages:

(i) A Substantial Size Distribution:

The quasi-random nature of the dewetting phenomenon results in a substantial nanoparticle size-distribution[21] which negates the use of the resulting nanoparticles in applications where the collective response of an ensemble of identical nanoparticles is desired or where they act as catalytic seeds for obtaining identical nanowires via the vapor-liquid-solid growth mode[32].

(ii) Lack of Control Over Nanostructure Size and Spacing:

As the film thickness is decreased the agglomerated particles become smaller[21]. This size reduction is accompanied by a disproportionate reduction in the average spacing between the nanostructures produced. This inability to tune the nanostructure spacing to the desired length-scale limits the ability to optimize plasmonic enhancements to photovoltaic[33] and light-emitting devices[34].

(iii) Dewetting Occurs Only for Select Film-Substrate Combinations:

The dewetting phenomenon is restricted to film-substrate combinations where the film surface energy is higher than the substrate surface energy. Even when that is the case, dewetting can be altered by the nature of the bonding between the film and substrate[35].

(iv) Lack of Control Over Nanostructure Placement:

Once again, the quasi-random nature of the dewetting phenomenon provides little control over the final placement of the nanostructures produced, although the step-terrace structures offered by miscut substrates can impose partial order[36].

Because solid state dewetting proceeds by surface diffusion away from edges that extend from the underlying substrate to the surface of the film, order can be induced into the agglomeration process through the establishment of lithographically patterned edges that, upon heating, retract in an organized manner[21,37,38,60,63]. Using this approach, in combination with epitaxial nickel films, Thompson and coworkers[23,39,63] have induced the assembly of shaped micrometer-scale nickel islands where the final shape is dependent on (i) the annealing conditions, (ii) the epitaxial relationship formed and (iii) the orientation of the lithographically defined edges relative to the substrate crystal structure. This "passive" templating procedure, however, is limited by the fact that order is imposed by patterns having nanoscale features before the dewetting step. For example, when a film is deposited on a substrate and patterned to form a square with width 'w' and thickness 'h', there exists a pattern-width-to-film-thickness ratio (i.e. w/h) below which the film is able to agglomerate into a single structure when heated and above which the film breaks up into multiple structures. This ratio is, under ideal circumstances, often below 100. For gold structures on a sapphire substrate, the w/h ratio is typically limited to about 50. This ratio value is derived from the theoretical calculations of Dornel et al.[60] utilizing the experimental gold-on-sapphire contact angle of 130°, but is also consistent with the present inventors' experimental findings. Calculations based on this value reveal that the final nanostructure cannot be smaller than about ¼ of the width of the original pattern. For example, pattern widths of less than 200 nm are typically required for the agglomeration of 50 nm nanostructures. Producing periodic templated structures on very small length-scales over large areas in a manner which preserves long range order becomes technically challenging and cost-prohibitive. As a result, conventional dewetting cannot economically produce the particle sizes that are desired for real-world applications.

The imposition of order onto the dewetting process through the use of lithographically-defined film edges[23,63], periodic templates[21,40] or substrate surface texture[17,41,63] has been demonstrated with varying degrees of success.

An alternate approach uses easily fabricated micrometer-scale templates to produce an array of larger structures which are subsequently reduced in size through the use of surface energy gradients[31] and/or high temperature anneals[21]. In principle, these templated dewetting techniques provide ways to fabricate large area nanostructured arrays. In practice, the areas defined by the template must become so small that template fabrication becomes the overriding obstacle. This impediment is further amplified by the disproportionate decrease in the areal extent over which agglomeration occurs as the film thickness is reduced[21]. Maintaining control over the process becomes increasingly challenging as the nanoparticle length-scale is reduced.

Conventional templated dewetting techniques can be used to fabricate arrays of micrometer-scale gold structures using the following procedure, illustrated by FIG. 1:

(a) A shadow mask consisting of an array of micrometer scale square openings is placed onto a sapphire substrate.

(b) A gold film is deposited onto the sapphire substrate through the shadow mask openings.

(c) The shadow mask is removed to leave well defined gold squares on the surface.

(d) The sample is heated to induce dewetting.

FIG. 2A shows an image of gold microstructures produced by the process of FIG. 1 when the film thickness is 160 nm. The shadow mask openings, and the resulting gold squares, are 5 µm across, positioned at 12.5 µm centers. Each square agglomerates into a single round particle approximately 2 µm across. This demonstrates how the simple procedure shown in FIG. 1 can be used to fabricate arrays through the conventional templated dewetting process. However, when the gold film thickness is reduced from 160 nm to 5 nm, instead of an array of single particles about 600 nm across, the same dewetting procedure instead yields as many as 40 smaller particles in each cell defined by the shadow mask. As shown in FIG. 2B, the particles are of uneven sizes and irregular spacing. That is a clear demonstration of the limitations of the conventional dewetting processes. A further thickness reduction to 0.5 nm produces a sample that shows nearly negligible agglomeration, as shown in FIG. 2C. Note that FIG. 2C is to a larger scale than FIGS. 2A and 2B, to show the very slight agglomeration more clearly. The scale bar is 20 µm in FIGS. 2A and 2B, and only 10 µm in FIG. 2C. This demonstrates that nanoscale particles are not readily fabricated through this procedure. The problem can in principle be resolved by reducing the size of the openings in the shadow mask to nanoscale dimensions, allowing a corresponding increase in the thickness of the gold film, but then the fabrication of the very fine mask becomes a major technological hurdle.

SUMMARY OF THE INVENTION

One aspect of the invention provides an apparatus and method for forming small structures, comprising: applying to a substrate a structural material and a layer or "pedestal" of a sacrificial material; maintaining the substrate at a temperature at which the sacrificial material evaporates or sublimes and the structural material is mobilized; and permitting the sacrificial material to evaporate or sublime, and an area of the substrate covered by the sacrificial material to diminish, and permitting the structural material to agglomerate on the remaining sacrificial material to form a said structure. The process typically concludes when the sacrificial material is exhausted and the structure come into contact with the underlying substrate. In an embodiment, the structural material is applied as a capping layer on top of the pedestal.

Without wishing to be bound by a particular theory, it is presently believed that in general, the sacrificial material should have a lower surface energy than the structural material.

Without wishing to be bound by a particular theory, it is presently believed that in general, the structural material should have a higher surface energy than the substrate. If that is not the case, then the structural material will want to wet the substrate surface, and therefore spread out over the surface, once the sacrificial material disappears and the structural material is in contact with the substrate. It is possible, however, that the tendency to wet could be counteracted by reducing the sample temperature before this wetting occurs. For this scenario, the structure formed by the structural material would be metastable.

The mechanisms driving dynamic templating are highly complex, involving a layered structure which emits material, intermixes, evolves from micrometer to nanoscale dimensions and where constituents undergo multiple non-equilibrium phase transitions between the solid, liquid and vapor phases. Nevertheless, certain significant features of embodiments of the process have emerged: (i) rapid loss of material from the pedestal through sublimation (or evaporation); (ii) preferential loss of this material from the pedestal sides due to the inhibition of the sublimation (or evaporation) process by a capping layer of structural material atop the pedestal; and (iii) formation of a liquid at the interface between the pedestal and the agglomerating structural material.

While the initial choice of antimony as the pedestal material was based on its low surface energy and propensity for sublimating at temperatures at which gold atoms typically agglomerate, the interactions between gold and antimony, as depicted by the Au:Sb binary phase diagram, lead to a far more complex situation. Of specific relevance is the fact that antimony is nearly immiscible in gold in the solid state (0.75 wt. % Sb), but forms a eutectic with gold which lowers the melting point to nearly one-third its bulk value ($T_E$=360° C.). Therefore, little interdiffusion is expected across an Au—Sb interface below the eutectic temperature. Above the eutectic temperature significant interdiffusion will occur, a process that ultimately gives rise to a transformation from the solid to liquid phase fields of the binary phase diagram. It should be recognized, however, that the binary phase diagram presents the equilibrium state; it does not offer information about the time-scales required to reach equilibrium. The situation is further complicated by the fact that antimony can diffuse through the gold layer and subsequently sublimate. The kinetics describing these processes are not documented, but likely play an important role in the assembly of the gold arrays.

The early stages of the assembly process see a temperature rise that leads to the onset of antimony sublimation. It is evident that this sublimation process is influenced greatly by the presence of a gold capping layer. Standalone antimony pedestals sublimate without any significant agglomeration and with material loss primarily through the top surface of the pedestal. The situation, however, is radically altered by the placement of gold on the pedestal, because a gold capping layer severely inhibits the antimony sublimation from the top surface. The result is a sublimation process dominated by the loss of atoms from the pedestal sides. The net effect is a highly anisotropic sublimation process that continuously reduces the top surface area of the pedestal. It is this antimony sublimation front that drives gold towards the center of the pedestal.

While the forced agglomeration of gold due to the advancement of the sublimation front represents a principal mechanism in the assembly process, it relies on maintaining a quasi-continuous capping layer that inhibits the sublimation through the pedestal top. The importance of maintaining this capping layer is apparent from an observed deterioration in the dynamic templating process (i) when sub-monolayer gold thicknesses are used and (ii) when the gold is intermixed with the antimony rather than placing it atop the pedestal. Even though some dissolution of antimony through the gold layer is inevitable, its lifetime on the gold surface will be short in duration due to the high antimony vapor pressure at the assembly temperature ($\approx 10^{-1}$ Torr). It would also likely be quite detrimental to the assembly process if the capping layer were to dewet on the top surface of the pedestal before the sublimation front arrived. Opposed to this tendency, however, is the wetting behavior derived from the formation of the Au—Sb eutectic arising from the dissolution of antimony into the gold layer. Such behavior, referred to as dissolutive wetting, has been observed both experimentally and in simulation in such systems as copper-on-silicon and tin-on-bismuth.

The inventors postulate that the dissolution of the pedestal material into gold is a significant mechanistic requirement to maintain the integrity of the capping layer in the Au—Sb system and, hence, enable the enhanced dewetting observed. In this respect, the formation of silver and germanium arrays is analogous to that of gold formation in that dissolution occurs through the formation of a eutectic. For other material systems (Pt, Cu, Ni, Co), where a low-temperature eutectic is not present, the dissolution is facilitated through the use of a thin liquid bismuth layer. This result suggests that other low melting point elements with high vapor pressures (e.g. Zn, Cd, Se, Te) could also act as effective pedestal materials.

In the late stages of the assembly process, antimony loss is so severe that the pedestal collapses, yielding a liquid phase antimony-gold structure that makes contact with the underlying substrate material. Continued heating leads to further antimony loss, which is followed by the onset of solidification when the antimony content drops below values needed to be in the liquid phase field of the binary phase diagram. That will result in the precipitation of gold from the liquid as antimony continues to leave the structure. The near-immiscibility of gold and antimony renders this transformation relatively straightforward. Eventually the antimony will be exhausted and the gold nanostructure will lie on the surface of the substrate with its contact angle in the equilibrium configuration.

A scenario has also been encountered in which the structural material (Fe) does not want to stay on the pedestal (bismuth). The assembly process ends up with ring shaped formations. That cannot presently be explained using simple surface energy arguments, but may be useful in special circumstances.

The best case scenario is presently considered to have a sacrificial material with a lower surface energy than the substrate, so that the sacrificial material does not tend to dewet on the substrate. This is observed for antimony on sapphire. However, for gold on bismuth on sapphire, the bismuth does tend to dewet but that does not adversely alter the gold assembly process.

The surface energy of the interface between adjacent layers may also be taken into consideration. In forming a hemispherical structure, the creation of the interface between the structural material and the substrate desirably reduces the overall surface energy. When that is not the case, the surface layer may tend to form a spherical structure to minimize its contact with the substrate.

The surface energy of most elements has been established both theoretically and experimentally. From a theoretical point of view, these are relatively straightforward calculations which show reasonable agreement with experiment. From an experimental point of view the problem can be somewhat more challenging as issues like crystallographic orientation and interface quality (oxide formation, impurities, surface morphology, surface reconstructions) play an important role. For the surface energies of interfaces, with the exception of certain commercially significant substrates (e.g. silicon) the situation is far less clear. Reported values vary widely and are often unknown. Substrate values are also subject to the same issues associated with crystallographic orientation and interface quality.

The process by which the area of sacrificial material diminishes, while the structural material remains within that area and so can be forced to agglomerate in a pattern controlled by the sacrificial material, is referred to in this specification as "dynamic templating."

In many embodiments, the resulting "structure" may be a small bead of the structural material, or of an alloy of the structural and sacrificial materials. As is explained below, the small bead can be a nanoparticle. Especially if the layer of sacrificial material is patterned, for example, into an array of discrete portions of the sacrificial material centered on intended locations of the structures, a corresponding array of beads or other pattern may be formed, and may be regarded as a single structure.

In an embodiment, the agglomeration is continued until the sacrificial material covering the said area of the substrate disappears, leaving a structure comprising the structural material on the substrate.

In an embodiment, the applying comprises applying a layer of the structural material. The layer of sacrificial material may be applied on the substrate, and the layer of structural material may be applied on top of the sacrificial material. Permitting the sacrificial material to evaporate or sublime may then comprise permitting the sacrificial material to evaporate or sublime at edges of the layers of structural and sacrificial materials. Alternatively, the structural material may be a layer under or within the sacrificial material, or may be dispersed through a matrix of the sacrificial material.

In an embodiment, there is a layer of a third material on the sacrificial material and under the structural material. The third material may be a material of intermediate properties.

The layer of structural material may be less than a monolayer. Absent a third layer, permitting the sacrificial material to evaporate or sublime may then comprise permitting the sacrificial material to evaporate or sublime at gaps in the layer of structural material to form additional edges. If there is a third layer, the third layer may agglomerate, with the sacrificial material vaporizing at the edges, and the structural material may agglomerate on top of the third material. The third material may then be vaporized so as to leave a very small structure of the structural material. Alternatively, the structural material and the third material may form an alloy, from which the third material then evaporates. The latter process is presently believed to apply, for example, to gold on silver. That approach may be useful where the volume of the final structure is so small that applying that volume as a monolayer would entail an area of structural material too small for easy patterning.

Examples of suitable sacrificial materials for certain embodiments are antimony, arsenic, bismuth, cadmium, lead, tellurium, zinc, bismuth telluride ($Bi_2Te_3$) and cadmium telluride (CdTe).

The final structure may be an alloy of the structural material and the sacrificial material, or may consist essentially of the structural material. In some embodiments, the structure may be recognized because at least one microstructure consists essentially of a first material, but includes a minor proportion of a second material, where the second material has a lower surface energy than the first material, and has a temperature of evaporation or sublimation at which the first material is mobile but not volatile, and the first and second materials are otherwise consistent with being the structural and sacrificial materials of the present processes, and the minor proportion of the second material is too high to be dismissed as a routine impurity.

Another embodiment of the invention provides a method of controlled emission of vapor, comprising: forming on a substrate a first layer of volatile material; forming on top of the first layer a layer of less volatile cap material, leaving a side edge of the first layer exposed; and heating the material to a temperature at which the first material emits vapor at a desired rate from the exposed side edge and the second material inhibits vapor emission from the top of the first layer.

In an embodiment, the cap material has a higher surface energy than the volatile material.

In an embodiment, the cap material has sufficient mobility at the mentioned temperature to dewet as the volatile material evaporates or sublimes.

The cap material may be substantially a monolayer.

A further embodiment of the invention provides a product comprising a substrate; a first material; and a layer of a second material; wherein the second material has a lower surface energy than the first material; and the second material evaporates or sublimes at a lower temperature than the first material.

The second material may be a layer on the substrate, with the first material being a layer on the second material.

The first and second materials may form a eutectic on melting.

There may be a layer of a third material between the second material and the substrate, where the third material has a lower surface energy than the second material.

Embodiments of the present invention make possible the precise fabrication of particles and other structures in the sub-micrometer to nanometer scale by first forming a structure in the size scale reasonably achievable by templating or other available techniques, and then reducing the area of the structure in a relatively controlled manner. Control that in conventional dewetting is lost as the dewettable layer becomes too thin can be regained through the formation of a much thicker 2-component structure where one component slowly sublimes, evaporates, or otherwise vaporizes. In this scenario, as the larger structure becomes progressively smaller, a second, more stable, component experiences a forced migration to progressively smaller length-scales. The end product, once the entire first component has sublimed or evaporated, can be a single particle of nanometer-scale dimensions.

Embodiments of the present invention can overcome or greatly mitigate the previous limitations of templated dewetting, through a processing route that can see orders of magnitude enhancements to the agglomeration process. The net effect of these enhancements allows atoms scattered more thinly over a much larger area to agglomerate into a single substrate supported structure. Embodiments of the devised fabrication route use one or more intermediate layers deposited between the substrate and agglomerating film as a sacrificial layer(s). This sacrificial layer forms a pedestal upon which the dewetting occurs. The pedestal material is chosen such that it sublimes (or evaporates) away from its sides creating a progressively smaller area on the top of the pedestal that can support the agglomerating film. This reduction in area results in a forced migration of the agglomerating atoms to the center of the pedestal. Eventually, the pedestal is completely annihilated leaving the agglomerated structure on the underlying substrate. A simple analogy to this process is one where a shrinking island will force its inhabitants to migrate to its center.

In contrast to the previous system illustrated by FIGS. 1 and 2, "dynamic" templating in accordance with embodiments of the present invention can support dewetting into a single structure for w/h ratios as large as 10,000 (for example, a pattern width w=5 µm divided by a gold film thickness h=0.5 nm). Thus, one major advantage of the dynamic templating approach is that much smaller structures can be assembled from a template of a set width. For the assembly of gold arrays on sapphire substrates, easily fabricated dynamic template widths of 1 µm can be used to fabricate nanostructured arrays as small as 100 nm. In comparison, passive templating can only achieve feature sizes down to 500 nm using the same template width.

For the case of dynamic templating, the limitation of the assembly process is not the template-width-to-gold-film-thickness ratio, but the ability to maintain a quasi-continuous capping layer on the surface of the pedestal. With experiments indicating that capping layer integrity is maintained for a monolayer of gold for four different pedestal widths (0.6, 1.2, 2 and 5 µm), this monolayer value provides in many embodiments an appropriate choice for determining the expected minimum feature size. The calculation illustrates that dynamic templating is likely to have a significant advantage over passive templating on all relevant length-scales. While shadow masks were used in the inventors' studies to form the dynamic template they are not a requirement of the assembly process. Any appropriate process, including conventional or unconventional lithographic processes, can be applied. Thus, the minimum feature size accessible through any of these individual lithographic techniques can be significantly improved upon through the formation and subsequent assembly of dynamic templates into much smaller structures.

The procedure has broad applicability, having already produced arrays of plasmonic, magnetic, and semiconducting materials.

BRIEF DESCRIPTION OF THE DRAWINGS

The above and other aspects, features and advantages of the present invention will be apparent from the following more particular description thereof, presented in conjunction with the following drawings. In the drawings:

FIG. 7C is an AFM image and transect graph of an array similar to that of FIG. 7A, in which the gold structures have been reduced in size by sublimation.

FIGS. 8A through 8H, collectively FIG. 8, are sets of micrographs illustrating the sublimation of (8A-8D) gold-topped and (8E-8H) standalone antimony pedestals.

FIGS. 9A through 9F are cross-sections through various pedestal architectures incorporating both gold and antimony.

FIG. 10 is a cross-section through a pedestal architecture formed through the placement of bismuth on antimony.

FIG. 11 is an oblique view of an alternative embodiment of pedestal architecture.

FIGS. 12A through 12I, collectively FIG. 12, are a compilation of SEM images showing arrays of various elements and alloys.

FIGS. 13A through 13H, collectively FIG. 13, are a compilation of images of arrays of sub-micrometer gold structures formed on a variety of substrates.

FIGS. 22A and 22B are atomic force microscopy (AFM) images, each with a graph of a representative transect cross-section, for randomly spaced gold nanoparticles.

DETAILED DESCRIPTION OF PREFERRED EMBODIMENTS

A better understanding of various features and advantages of the present invention will be obtained by reference to the following detailed description of embodiments of the invention and accompanying drawings, which set forth illustrative embodiments that utilize particular principles of the invention.

In one embodiment, larger structures could first be produced by templated dewetting and subsequently reduced to the nanoscale. While it is apparent that size-reductions through sublimation or evaporation are possible, control is, once again, difficult to attain, because even a reduction from 300 to 30 nm in the linear dimensions of a structure requires a thousand-fold reduction in the volume of the structure. Control can be regained, or at least improved, through the formation of a much thicker 2-component structure where, at temperatures at which the first or structural component will migrate, the second or sacrificial component slowly sublimes or evaporates. Then, as illustrated by FIGS. 8A-8D, a larger structure becomes progressively smaller as the first, more stable component experiences a forced migration to progressively smaller length-scales. The end product, once the entire second, more volatile component has sublimed or evaporated, may be a single particle of nanometer-scale dimensions.

Figure 2B:
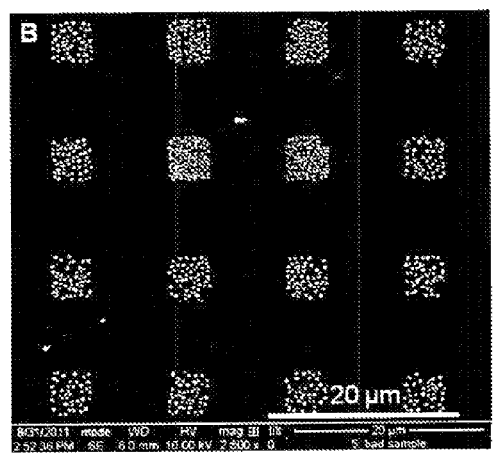
Figure 2C:
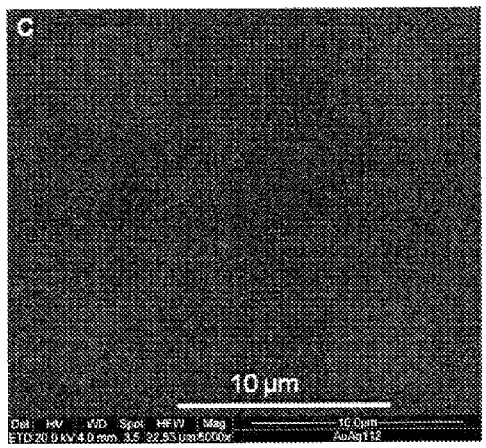
Figure 3:
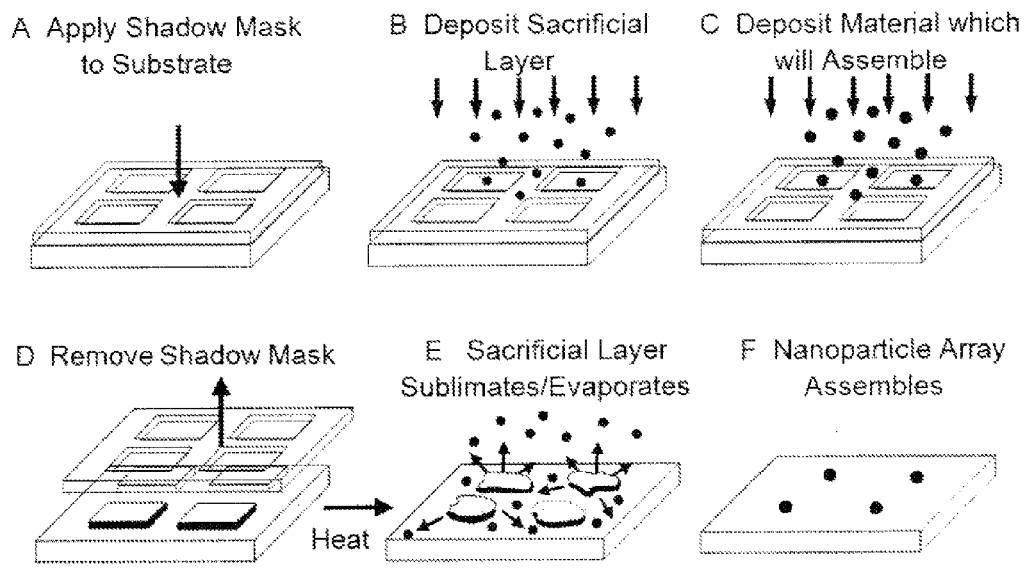
FIGS. 3A through 3F are a set of schematics illustrating a first embodiment of a dynamic templating process.

An embodiment of a processing route used to fabricate periodic arrays of sub-micrometer- and nanometer-scale structures is shown schematically in FIG. 3. In FIG. 3A, a shadow mask consisting of an array of micrometer-scale square openings is placed over the substrate. In FIG. 3B, a thicker sacrificial layer (for example, antimony or bismuth) is deposited through this mask onto the substrate. In FIG. 3C, that is followed by a thinner layer of the structural material that will ultimately assemble to form the sub-micrometer- or nano-structure. The thinner layer may be sufficiently thin that, as shown in FIGS. 2B and 2C, it would not agglomerate properly if deposited directly onto the substrate. In FIG. 3D, the shadow mask is then removed.

In FIG. 3E the remaining layered structure is heated to a temperature amenable to solid state dewetting of the final material and the sublimation (or evaporation) of the sacrificial material. The temperature regimen used for this purpose is highly dependent on the pedestal-nanostructure-substrate combination used. Nanostructure-substrate combinations able to withstand high temperatures (e.g. Au, Pt, Ni, Co on sapphire) were ramped to temperatures in excess of 1000° C. and then allowed to cool to room temperature. Those unable to withstand this environment because of excessive sublimation (e.g. Ag), nanostructure-substrate interdiffusion (e.g. Au on silicon) or substrate reactions with the small oxygen partial pressure within the tube furnace (e.g. Au on graphene) were heated to lower temperatures (typically 750-900° C.) for longer periods of time (typically 30-60 minutes) to achieve the same end-result. In contrast to conventional templated dewetting where the structure assembles on a substrate material, the structure must now agglomerate upon a sacrificial pedestal that is simultaneously being annihilated as atoms leave the structure through sublimation or evaporation and substrate surface diffusion. This reduction in pedestal area results in a forced migration of the agglomerating atoms to the center of the structure, preventing the formation of numerous smaller structures that was shown in FIGS. 2B and 2C. Once all the sacrificial material is driven from the substrate surface through sublimation or evaporation, a single structure is left in the center, as shown in FIG. 3F. The terminology "dynamic template" has been adopted to describe the shrinking pedestal. It is used to contrast its dynamic nature with the "passive" templates used in conventional templated assembly. The nomenclature of passive and dynamic templating will, hence, refer to the conventional and new fabrication route, respectively, but it should be recognized that the present embodiment new route combines both passive (i.e. the shadow mask) and dynamic templating steps.

Figure 4:
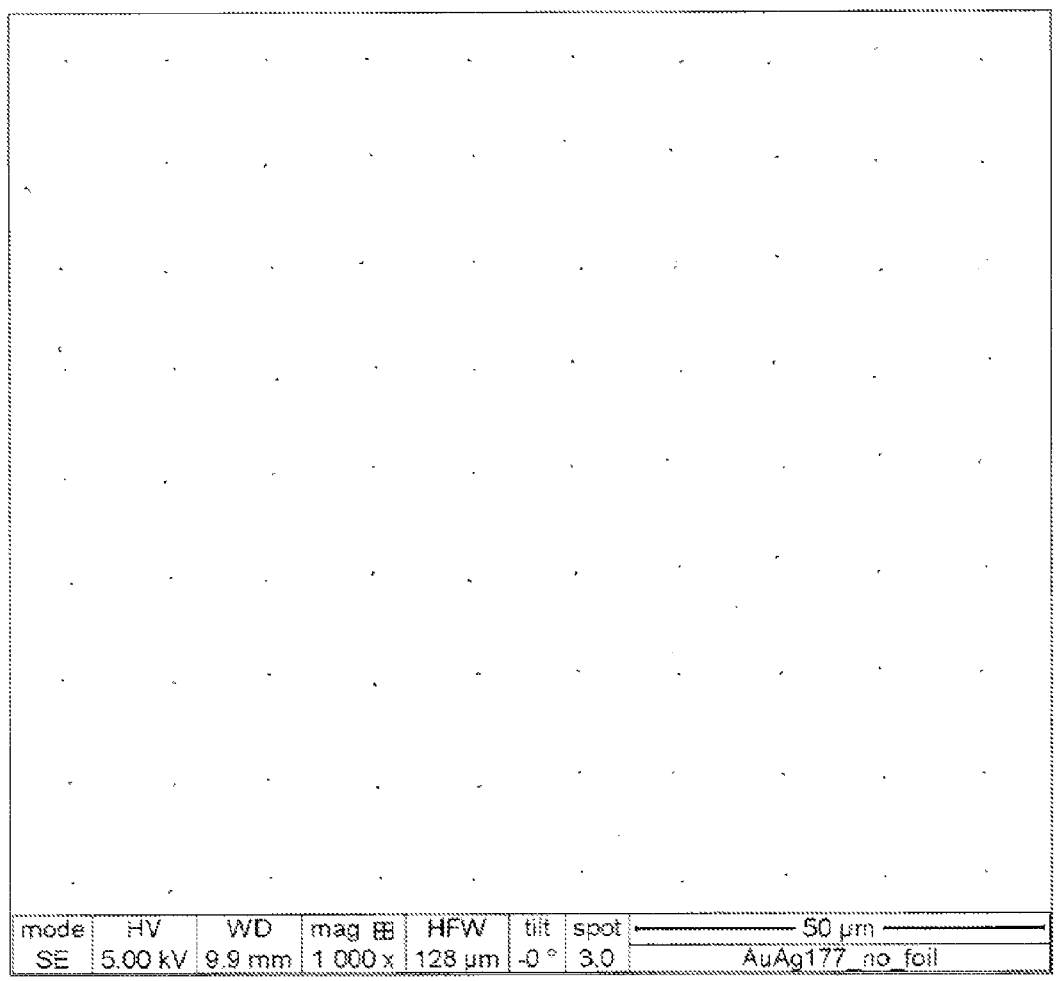
FIG. 4 is an image of an array of sub-micrometer gold structures.

FIG. 4 is an image of an array of sub-micrometer gold structures (diameter=331 nm) formed using dynamic templating by the process of FIG. 3 on a (0001)-oriented sapphire substrate using an antimony pedestal.

Figure 5:
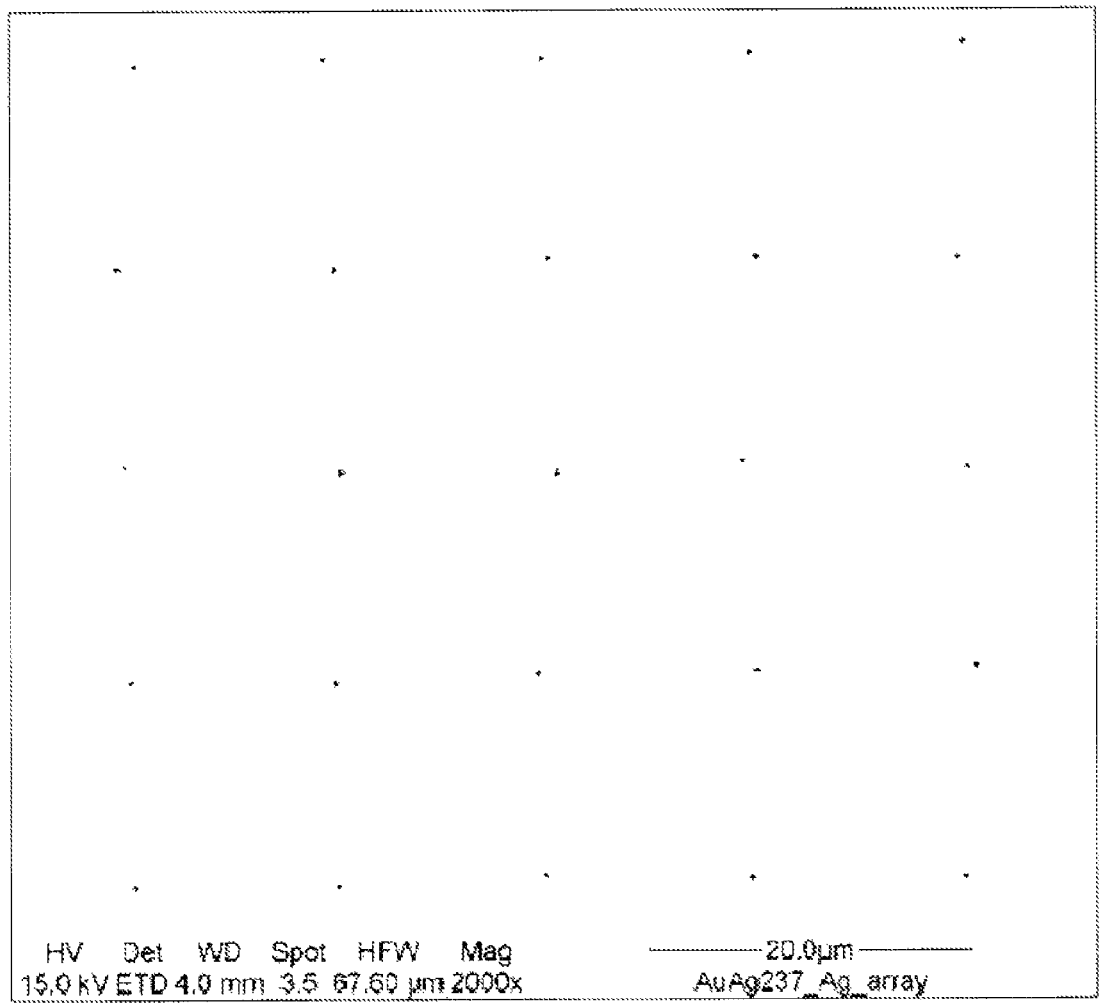
FIG. 5 is an image of an array of sub-micrometer silver structures.

FIG. 5 is an image of an array of sub-micrometer silver structures (diameter=258 nm) formed using dynamic templating by the process of FIG. 3 on a (0001)-oriented sapphire substrate using a bismuth pedestal.

Although FIG. 3 shows the use of a shadow mask to form the dynamic template, that is not a requirement of this assembly process. Any practical method, whether conventional or unconventional or hereafter to be developed, may be used. For example, a lithographic process could be applied.

Figure 1:
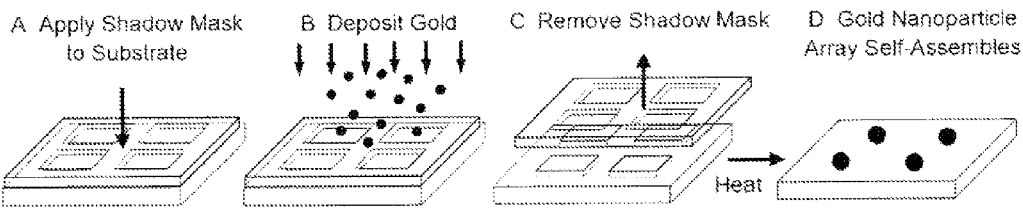
FIGS. 1A. 1B, 1C, and 1D are a set of schematics showing a procedure for producing arrays of gold structures using conventional templated dewetting.
Figure 2A:
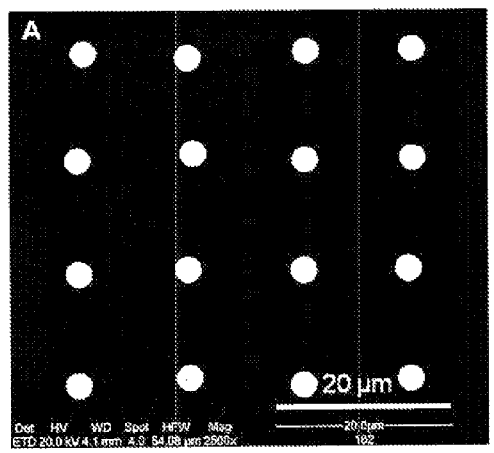
FIGS. 2A through 2C are micrographs of gold nanostructures produced using the templated dewetting procedure of FIG. 1 for initial gold film thicknesses of (A) 160 nm, (B) 5 nm and (C) 0.5 nm.

Although the embodiment of FIGS. 1 to 3 uses a shadow mask consisting of an array of 5 µm square openings placed over the substrate, these openings could also be of other sizes, including sub-micrometer or nanometer sizes. That would make possible the formation of smaller and/or more densely packed structures, but fabrication of progressively smaller masks becomes progressively more difficult. It is expected, however, that as ways to easily fabricate such masks become available, the dynamic templating process will still be useful to achieve even smaller structures.

FIGS. 1 to 3 use a shadow-mask having a regular array of square openings because such masks are readily available. Other shapes may be used. From a dewetting point of view circular openings are believed to be optimal, but uses exist for mask openings with different shapes, some of which are described below. Similarly, a pattern other than a regular array can be produced by starting from an appropriate shadow mask, lithograph, or other initial pattern.

It is also possible to simultaneously assemble different size nanostructures by fabricating side-by-side pedestals where the top areas have different initial sizes. Larger areas would yield larger nanostructures, assuming that the thickness of the layer of structural material applied to all the pedestals is uniform. For example, if a line of pedestals are fabricated all of the same height, but where the top area becomes smaller and smaller, dynamic templating would yield a row of nanostructures where the nanoparticle size systematically decreases. If the metallic nanostructures produced by the present process are used as seeds for the fabrication of semiconducting nanowires, varying the size of the nanostructures would allow for the side-by-side fabrication of nanowires with different properties. For example, if a small seed was placed next to a large seed then the nanowire growth would yield a tall thin nanowire next to a short wide nanowire.

Bismuth and antimony have been mentioned as suitable materials for the pedestal. Other materials could be used instead, depending in part on the properties of the substrate and the material of the final structure. The properties of a good sacrificial material are described below.

The effectiveness of dynamic templating deteriorates when the thickness of the material deposited on the pedestal is significantly below a monolayer. That may be because holes form in the sacrificial layer at bald spots in the monolayer, and the sacrificial layer shrinks away from those holes. Embodiments in which that is deliberate and desirable are described below. For shadow masks with 5 µm×5 µm openings there is, thus, a minimum diameter nanostructure achievable using dynamic templating. If shadow masks having smaller openings are used then that will obviously reduce the minimum size of microstructure attainable. If the area of the opening on the shadow mask is reduced by a factor of eight (corresponding to reducing the side of a square by a factor of about 2.83) then the minimum particle diameter attainable is reduced by a factor of two. If small nanoparticles are desired, that approach quickly leads to the need for mask openings having length-scales that are not readily available at the time of writing.

Figure 6A:
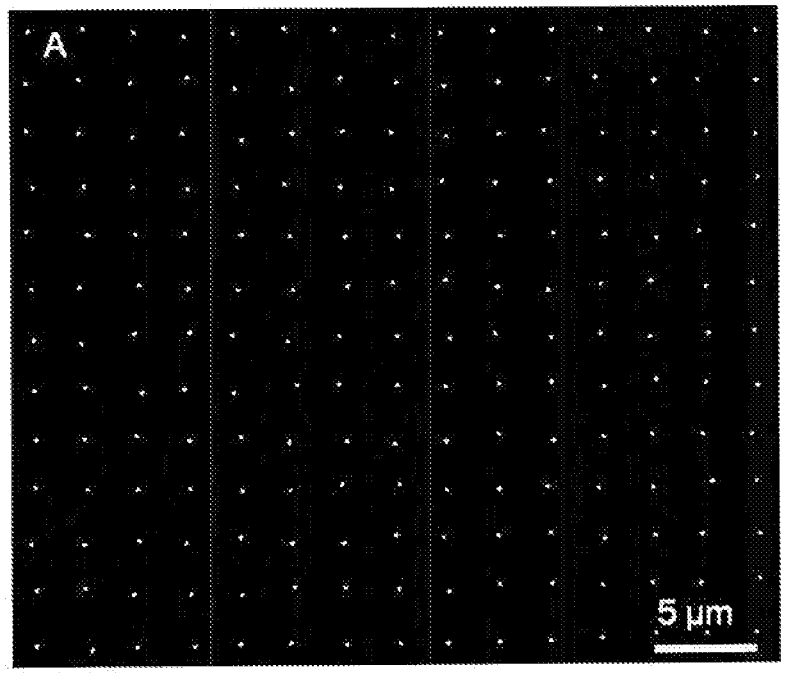
FIG. 6A and FIG. 6B are SEM images of arrays of sub-micrometer gold structures at closer spacings than in FIG. 4.
Figure 6B:
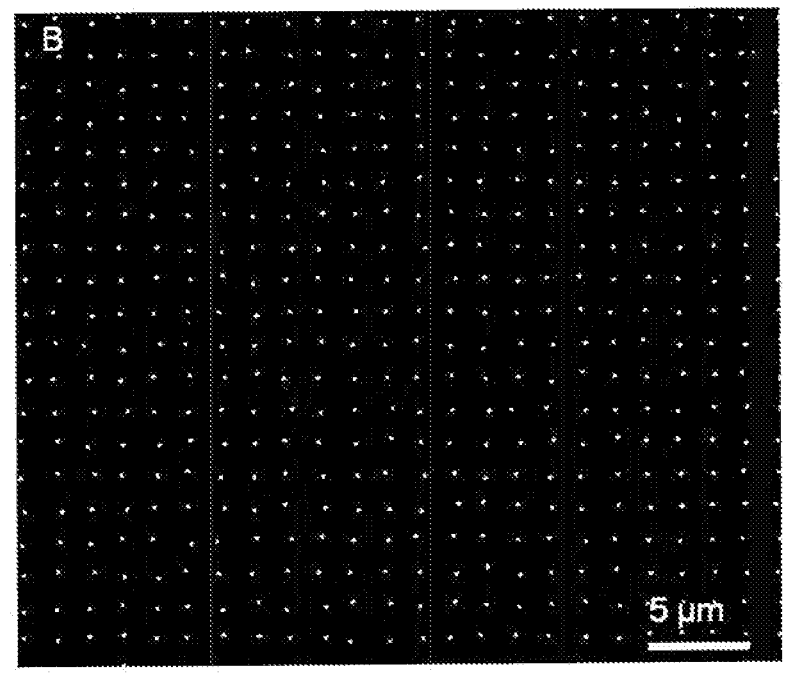
Figure 6C:
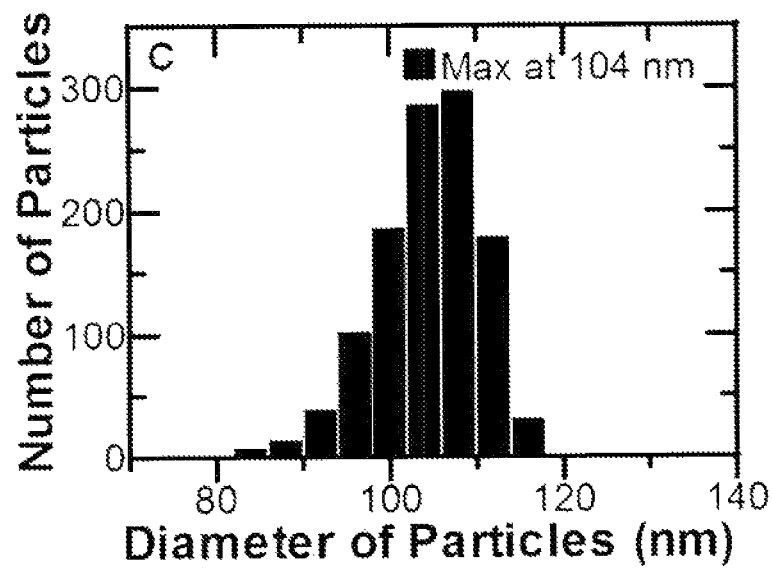
FIG. 6C and FIG. 6D are histograms of the particle size distributions in the arrays of FIG. 6A and FIG. 6B, respectively.
Figure 6D:
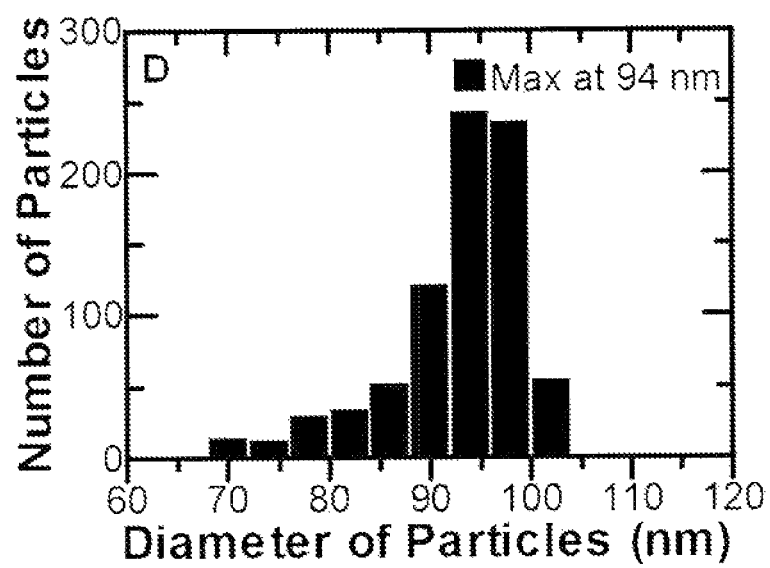

In addition, while shadow masks with 5 µm×5 µm square openings and 12 µm center-to-center distances between openings were satisfactory to demonstrate experimentally the enhanced dewetting characteristics available through dynamic templating, the low density of the resulting structures is unsatisfactory for many commercial applications. The collective optical response from an ensemble of such nanostructures is also quite weak. From both of those standpoints, dynamic templating using shadow masks with smaller openings and closer center-to-center distances is likely to be more useful. That also allows for the use of antimony pedestals with significantly reduced heights. To illustrate the feasibility of smaller mask sizes, FIGS. 6A through 6D demonstrate this capability showing periodic arrays of gold nanostructures with a 21-fold and 56-fold increase in particle density ($1.5\times 10^7/cm^2$ and $3.9\times 10^7/cm^2$). They were fabricated using shadow masks with 1.2 μm and 0.6 μm diameter round openings and center-to-center distances of 2.6 μm and 1.6 μm, respectively. The arrays exhibit narrow size distributions with approximately 90% of the structures falling within ±10 nm of the histogram maximum. The structure of FIG. 6A shows a plasmon resonance centered at a wavelength of 590 nm. The formation of periodic arrays of both gold and silver have been demonstrated at these higher densities.

In an alternative embodiment, a two-layer dynamic template consisting of a 0.3 μm high antimony pedestal topped with 4 nm of silver is formed, by repeating the step shown in FIG. 3B. A sub-monolayer of gold is then deposited on the silver in the step of FIG. 3C. Silver is chosen because it is prone to sublimation at a higher temperature than antimony, but a lower temperature than gold. When heated, the gold and silver agglomerate together as the antimony pedestal is annihilated. Then at elevated temperatures the silver sublimes leaving behind a gold nanostructure. This embodiment has been shown capable of producing gold nanostructures on sub-100 nm length-scales. The same process has been used for nickel instead of gold.

Figure 7A:
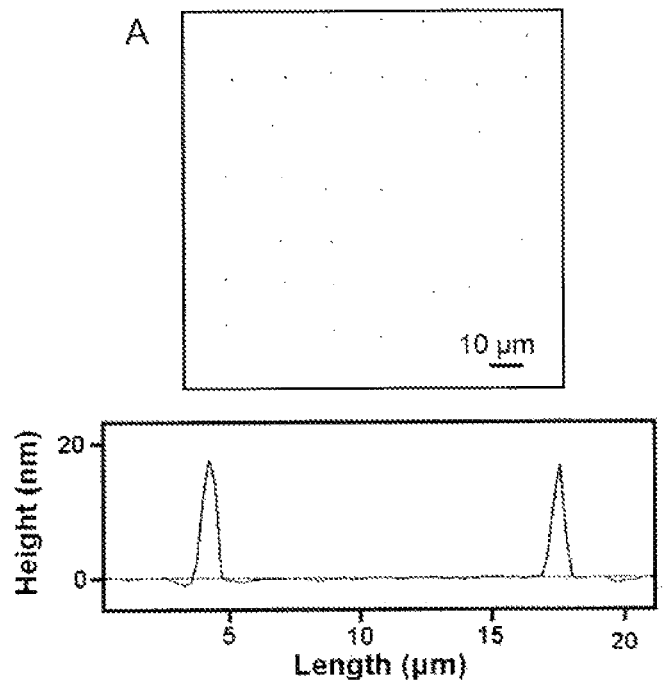
FIGS. 7A and 7B are atomic force microscopy (AFM) images, each with a graph of a representative transect, of sub-50 nm (7A) gold and (7B) nickel arrays formed using dynamic templating but where a two-layer pedestal was utilized.

The enhancement to the agglomeration process made possible using this method is so extraordinary that it is now possible to accumulate in a predetermined location a mere 700,000 gold atoms, initially scattered over a 25 μm² area, into a single hemispherical nanoparticle with a radius of 18 nm. An Atomic Force Microscopy (AFM) image and a transect plot of the thickness through several nanoparticles are shown in FIG. 7A. The overall assembly process is, thus, characterized by a 600,000-fold volume reduction between the initial pedestal and the final nanostructure. For passive templating to achieve the same degree of success, a gold film thickness of 1/500 of a monolayer deposited over the same area would have to agglomerate into a single nanostructure, a scenario which is of infinitesimal probability.

A drawback to using this Ag—Sb multilayer pedestal is that higher processing temperatures or significantly longer anneal times are required to reduce the silver content of the nanostructure to levels below detectability. An advantage that is overriding in appropriate cases, however, is that easily manufactured shadow masks having micrometer-scale features can be used to fabricate nanoscale structures.

Figure 7B:
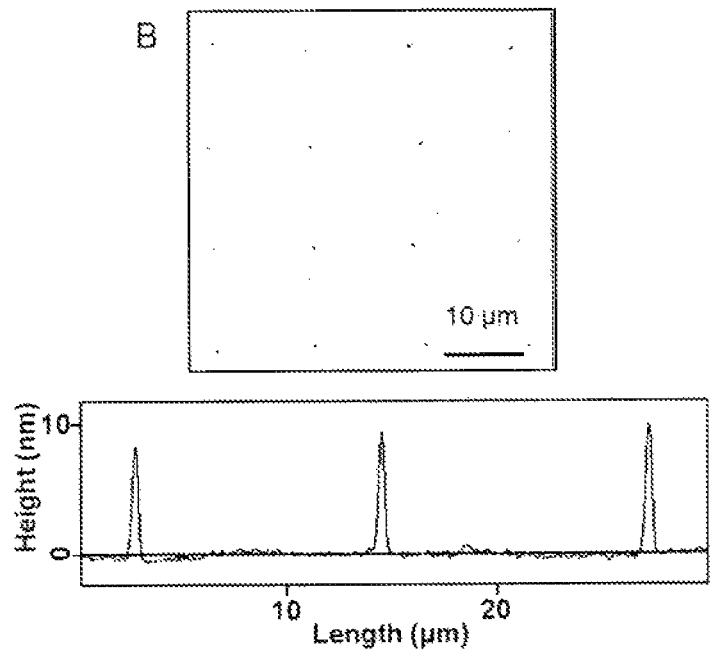

Following a similar approach, nanostructured nickel arrays were produced using a sub-monolayer nickel film on a two-layer pedestal consisting of antimony topped with % of a monolayer of gold. In this case, the assembly process takes advantage of the fact that gold has a significantly higher vapor pressure than nickel. Dynamic templating resulted in assembly of arrays having a radius of 12 nm, as shown in an AFM image and graph in FIG. 7B. With diameters of approximately 25 nm these are the smallest nanostructures produced using a dynamic template at the time of writing. This corresponds to the assembly of 330,000 atoms which were initially scattered over a 25 μm² area (1/1400th of a monolayer) into a single nanoparticle. With an initial antimony layer about 0.5 μm thick, this corresponds to a 3,000,000-fold volume reduction between the initial pedestal and the final nanostructure. This result exceeds the capabilities of both e-beam and photolithographic processes. This approach has not yet been tried with any other materials.

We have further shown that gold nanoparticles such as those shown in FIG. 7A can, through gold sublimation, be reduced to arbitrarily small sizes. FIG. 7C is an AFM image of gold nanoparticles that have been reduced in size through gold sublimation, which demonstrates the sizes possible. Obtaining these 1 nm height structures with the correct periodicity is remarkable. If such structures remain near-hemispherical, then the number of atoms in each structure is a few hundred. In the array shown in FIG. 7C, approximately 10% of the structures have completely sublimed away.

One of the useful features of dynamic templating is that, using the same technique, either monolayer or sub-monolayer quantities spread over micrometer-sized dimensions can be assembled into a single structure. Only the quantities of metal deposited, and sometimes the presence or absence of the second pedestal layer, need be varied.

One monolayer of gold over a 5 μm×5 μm shadow mask opening will yield a 280 nm diameter nanostructure. It is possible to go somewhat below a monolayer and still form a single nanoparticle without needing a two-layer pedestal, but a true lower limit has not yet been established.

FIG. 8 shows comparative sequences of gold-topped antimony pedestals (FIGS. 8A-8D) and antimony pedestals without a top layer (FIGS. 8E-8H). In order to gain insight into the underlying mechanisms governing this process, each series of SEM images was generated where the dynamic templating process was interrupted at various stages by heating the pedestals to progressively higher temperatures of 550° C., 600° C., 605° C., and 615° C., in order from 8A-8D and from 8E-8H, and then quenching them. The temperatures are the same for FIGS. 8A-8D as for 8E-8H. These samples were heated from room temperature to the temperature where quenching took place in 8 to 10 minutes depending on the temperature. The heating rate was the maximum ramp rate of the furnace used, and was not a linear ramp. The pedestals are initially 5 μm×5 μm×200 nm high and the gold thickness for FIG. 8A is 0.25 nm. The substrate is (100) silicon with a native oxide layer.

As may be seen from FIGS. 8E-8H, the standalone pedestals retain their original areal dimensions as they sublime, but form holes, break up, and ultimately disappear from the substrate surface.

In contrast, as may be seen from FIGS. 8A-8D, the dynamic templating process is characterized by well-defined edges that retract in an organized manner as the pedestals diminish in size from the original pedestal structure to a single hemispherical gold nanostructure. The structure imaged at 615° C. is still antimony-rich (55 wt. % Sb), but further heating drives away the remaining antimony.

In terms of understanding the dynamic templating process shown in FIG. 8 there exist a number of relevant factors regarding antimony:

(i) Antimony readily sublimes in the temperature regime where gold films typically dewet (i.e. where gold atoms have significant surface mobility).

(ii) Antimony has a much lower surface energy than gold[42], an attribute which promotes gold agglomeration while limiting antimony's own tendency to dewet on the substrate which it is deposited.

(iii) Antimony is nearly immiscible in gold in the solid state (0.75 wt. % Sb), but is completely miscible in the liquid state.

(iv) Antimony forms a eutectic with gold that has a melting point (355° C.) which lowers the melting point to nearly one-third of the bulk value of gold (1064° C.).

(v) Antimony is well-known for its effectiveness as a kinetically active surface agent able to alter thin film growth modes (i.e. surfactant-mediated epitaxy)[43,44].

Together, these factors combine to create a highly complex kinetically active system. From the progressions shown in FIGS. 8E-8H it is evident that the standalone pedestals sublimed without any significant agglomeration, a property consistent with a surface energy that is lower than the underlying substrate. For this case, antimony sublimation is primarily through the loss of atoms through the top surface of the pedestal due to the much higher surface area. The situation, however, is radically altered by the placement of gold on the pedestal, FIGS. 8A-8D, as the gold layer severely inhibits the antimony sublimation from the top surface, the result of which is a sublimation process dominated by the loss of atoms from the pedestal sides. The net effect is a highly anisotropic sublimation process that continuously reduces the top surface area of the pedestal while simultaneously driving gold towards the center of the pedestal. Eventually, antimony loss is so severe that the pedestal collapses, yielding an antimony-gold structure which, in time, loses the remaining antimony to form a single gold nanostructure.

The desirability of maintaining a gold capping layer on the pedestal is also apparent from the observed deterioration in the dynamic templating process for sub-monolayer gold thicknesses. For this scenario, antimony sublimation though the top surface is now possible and any gold nanoparticles formed on the pedestal surface will likely burrow into the antimony to reduce the overall surface energy[45]. It is also possible that antimony promotes the formation of a continuous gold layer across the top surface of the pedestal by lowering the Ehrlich-Schwoebel barrier[44], a process analogous to that used to promote the Frank-van der Merwe growth mode via surfactant-mediated epitaxy[43,44]. Results also suggest that the agglomeration of gold is not entirely reliant on solid state dewetting of gold on antimony, but is instead enhanced considerably by the liquid phase associated with the Au—Sb eutectic. That conclusion is based on a number of observations:

(i) Antimony is an effective pedestal material mainly for those elements forming a eutectic, for example, Au, Ag, Cu, Ge. With other elements, enhanced dewetting is still observed, but the enhancement is often not sufficient to form an array with a single nanoparticle structure in each cell of a shadow mask with a 5 μm×5 μm opening, starting at monolayer thickness. If sufficiently smaller openings were used an array of single particles would likely form.

(ii) Array formation for elements having a high or no eutectic temperature with antimony can be induced through the inclusion of a thin bismuth layer between the element and the antimony pedestal. For this case, bismuth, which becomes liquid at 271° C., is presently believed to play the same role as the surfactant.

(iii) Bismuth, by itself, promotes the templated assembly of a wider range of materials. If a liquid phase is, indeed, a requirement for templated dewetting then agglomeration is likely influenced by the viscosity of the liquid and Marangoni flows.

(iv) Two molten metals are almost always miscible according to their binary phase diagram. Bismuth has a low melting point (271° C.), and so will always be liquid as the assembly process of the present embodiments occurs. If the metal on top of the bismuth pedestal does indeed mix with bismuth then the assembly process may have a different mechanism than what is observed for antimony because, once mixing has taken place, bismuth should be able to evaporate easily from the top surface of the pedestal. Our current expectation is that bismuth and antimony share the same mechanism. That is possible if the kinetics associated with the mixing are slow compared to the evaporation processes resulting from the temperature regimen used.

(v) Templated assembly using liquid bismuth as a pedestal material is now proving more effective than using antimony in many cases. High quality arrays have been obtained for a wider variety of materials. However, bismuth has not, thus far, proved more successful than antimony in the templated assembly of small nanostructures, such as those shown in FIGS. 7A, 7B, and 7C. Without wishing to be bound to a particular theory, this may be due to miscibility issues.

Investigations, thus far, suggest that the ideal pedestal material for many purposes has the following properties:

(i) It readily sublimes or evaporates at temperatures where the material on its surface has sufficient mobility to agglomerate.

(ii) If the pedestal is annihilated through sublimation then it should form a eutectic with the material on its surface.

(iii) If the pedestal is annihilated through evaporation then the material on its surface should not dissolve into the structure in significant quantities on time-scales smaller than the time needed for the assembly process.

(iv) The pedestal should be immiscible in the solid state with the material on its surface.

(v) The pedestal material should not form a compound with the element on its surface unless the compound is the end-product desired.

Numerous pedestal geometries or architectures can be conceived. For the gold-antimony system the architectures which are shown schematically in FIGS. 9A-9F have been tried. The gold layer can be placed (A) on the top of the pedestal, (B) underneath the pedestal, (C) in the middle of the pedestal or (D) in small particles mixed throughout the pedestal. The antimony can also be (E) a continuous layer with separate areas of gold or other final material; or (F) a stepped layer. For all cases, enhanced dewetting has been observed. However, the pedestal structure shown in FIG. 9A has consistently yielded the best results in experiments to date.

FIG. 10 shows another possible pedestal structure, using two sacrificial layers. We have also demonstrated that the placement of bismuth on an antimony pedestal can enhance agglomeration for elements having a high eutectic temperature (e.g. Cu) or no eutectic (e.g. Co) with antimony. As mentioned elsewhere in this specification, the two-layer pedestal structure, with a less volatile second sacrificial layer, can also be used for creating sub-100 nm nanostructures where the cap layer of the final material is substantially less than a monolayer.

Much smaller particles formed at the periphery of the pedestal represent the most commonly observed array defect. FIG. 11 shows a proposed pedestal architecture that would likely reduce the number of array defects. As shown in FIG. 11, the metal is deposited onto the top surface of the pedestal such that the edge of the metal is slightly away from the edge of the pedestal. That could be accomplished using either multiple masks with appropriate alignment markers or through lithographic means.

More complex pedestals and sequences of operation can also be used. For example, it may be possible to bring two materials together in an organized manner by coating half the pedestal with one element and other half of the same pedestal with a second element. It may be possible to form two nanostructures in close proximity. It may be possible to stack structures on top of one another.

Dynamic templating has been used to fabricate periodic arrays of gold, silver, copper, platinum, nickel, cobalt, germanium, and various alloys. FIG. 12 shows a compilation of SEM images of arrays of those materials, including Au 50% Ag 50% and Pd 70% Sb 30% as representative alloys, where the percentages are atomic %. In addition, we have observed enhanced dewetting, although no array formation for a shadow mask with 5 μm×5 μm openings, for 1 nm thick iron on an antimony pedestal, and 1.5 nm silicon on a bismuth pedestal. This demonstrates that the procedure has broad applicability, having already produced arrays of plasmonic, magnetic, and semiconducting materials.

Silicon seems to be a likely candidate for dynamic templating. The poor results so far obtained are likely due to the fact that silicon is prone to oxidation which, once it occurs, will inhibit diffusion. Iron and other materials such as aluminum likely have the same problem. Carrying out dynamic templating in an ultra-high vacuum chamber would likely resolve this problem.

The ability to form alloys of plasmonic materials (Cu, Au, Ag) is important because this will allow for the plasmon resonance to be tuned to the desired frequency.

When forming an Au—Ag alloy structure, the initial deposition of metal was from two elemental targets, and the layer of structural material was formed through a series of 20 depositions which alternated between the gold and silver targets. We have not yet determined whether the intermixing of gold and silver is necessary for alloy formation. The processing temperatures for the agglomeration and assembly stage should be low enough to avoid significant silver sublimation. In contrast, in the case described above with reference to FIG. 7, in which silver was used as a second sacrificial layer, the gold was deposited in a separate layer on the silver and the assembly temperature was high enough to sublimate the silver.

We have not yet determined whether the intermixing of gold and silver is necessary for alloy formation, and the placement of gold on top of silver for gold nanoparticle formation, are necessary.

In the case of an Au—Ag heterojunction, described below with reference to FIGS. 16 and 17, a gold array is first formed on the substrate surface and then a silver array is formed in a manner where the silver assembles and forms contact with initial gold structure. The temperature for silver array formation should be low enough to avoid significant gold-silver interdiffusion and silver sublimation.

For some materials (e.g. palladium on an antimony pedestal) the inventors have not been able to remove the antimony from the nanostructure. The inventors believe they are forming the compound $Pd_3Sb$ based on the atomic percentages observed in the structures, although at the time of writing that had not yet been verified with x-ray diffraction. The ability to form compounds may be useful in the formation of arrays of materials such as AlSb and InSb which are well-known III-V semiconductors. If arsenic can be used as a pedestal material, which is likely because it is in the same column of the periodic table as bismuth and antimony, then arrays of the semiconductors GaAs and InAs may also be possible.

It is also likely that dynamic templating could be used to create core-shell structures (a core of one element or other material surrounded by a shell of a second element or other material). There are many examples where such structures form spontaneously when the two materials are immiscible. With a suitable pair of materials, it may be sufficient to deposit both immiscible materials on the pedestal and apply dynamic templating, allowing the materials to assemble to form a single particle that takes on the core-shell geometry.

FIG. 13 shows a compilation of micrographs of arrays of sub-micrometer gold structures formed on a variety of substrates: silicon, graphene, sapphire, silicon carbide, yttrium-stabilized zirconia (YSZ), $MgAl_2O_3$, $SrTiO_3$, glass (Eagle XG). The results demonstrate that a wide variety of substrates support dynamic templating. The graphene, obtained from a commercial vendor (Graphene Supermarket), was grown on a copper foil and transferred to a silicon wafer with a 285 nm silicon dioxide layer.

Dynamic templating of gold on an antimony pedestal on substrate-supported monolayer graphene resulted in the formation of satisfactory gold arrays, but SEM images showed some darkening at the locations occupied by the pedestal prior to its sublimation. Raman measurements on these areas reveal the characteristic G- and 2D-bands (at 1606 $cm^{-1}$ and 2707 $cm^{-1}$, respectively) of single layer graphene as well as the D-band (at 1361 $cm^{-1}$) associated with defects. The defects, however, may be entirely due to the fact that graphene deteriorates at high temperatures when exposed to oxygen, and are not necessarily caused by the dynamic templating process. If that is the case, then carrying out the same procedure in a high vacuum environment instead of a tube furnace with flowing argon could remedy this problem. It is noted that when gold is dewetted directly on graphene (i.e., the case of conventional "passive" dewetting) the 2D-band is absent because of severe degradation in the lattice structure.

For conventional dewetting of gold on silicon, silicon from the substrate enters the gold particle and melts it by forming the gold-silicon eutectic. When the particle is subsequently cooled, gold and silicon will phase separate. The intervening pedestal layer in dynamic templating may prevent this from occurring due to an interface layer.

The literature shows that there exist numerous possibilities for the separation of the gold and silicon, including: (i) a rim of silicon around the base of the particle where the particle has partially penetrated into the surface; (ii) a multiphase particle; and (iii) a gold particle encapsulated in a silicon shell. Through the use of a preferential etch that attacks gold but not silicon, the inventors have determined that the structures formed are gold and not a gold-silicon mixture. These results also indicate that the gold burrows into the silicon to some degree, because a circular etch pit with a silicon rim is left behind when the gold is removed.

With two exceptions dynamic templating has worked on all substrates tried. Germanium and GaAs substrates did not work with an antimony pedestal because of a strong interaction between the substrate surface and antimony, which left the substrate pitted. Bismuth also left both these substrate surfaces corrupted. However, the literature shows that the exposure of GaAs and Ge substrates to an argon atmosphere results in a deterioration of the surface. It is, thus, unclear whether the lack of success with these two substrates is due to this deterioration, the dynamic templating process or a combination of the two. Carrying out dynamic templating in a vacuum environment would resolve this issue.

Germanium structures have been successfully assembled on (100) silicon substrates, which demonstrates that semiconductor heterojunctions can be formed.

Figure 14:
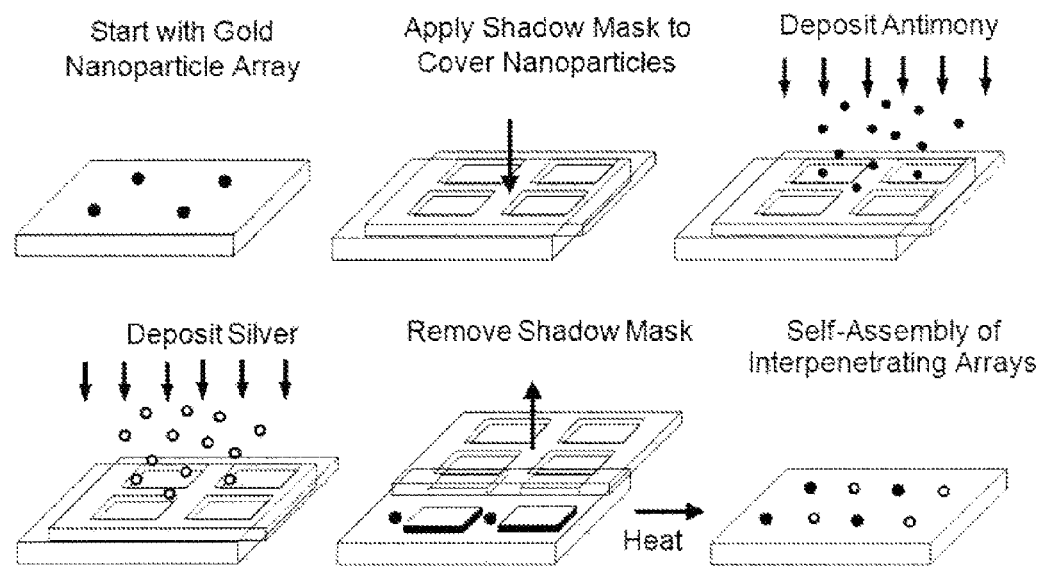
FIG. 14 is a set of schematics showing a fabrication process used to form interpenetrating arrays of nanostructures.
Figure 15:
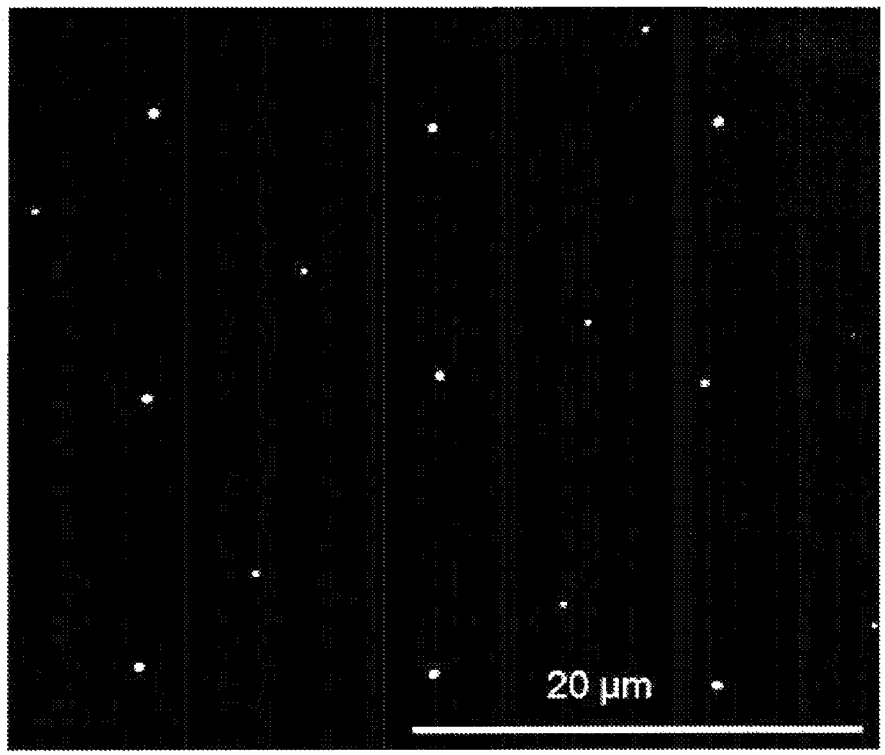
FIG. 15 is a micrograph of interpenetrating arrays of larger Ag and smaller Au nanoparticles on silicon.

Referring to FIG. 14, dynamic templating also lends itself to multistep processing where individual arrays are deposited in succession. FIG. 14 shows a schematic of a processing route leading to the formation of interpenetrating arrays of gold and silver nanostructures. A gold array is first formed using dynamic templating by the process of FIG. 3. A second shadow mask of the same periodicity is then positioned on the substrate surface, but with a lateral placement that is chosen offset relative to the gold array to shadow the gold nanoparticles. The antimony pedestal is then deposited through the second shadow mask, followed by a thin layer of silver. After mask removal, the remaining structures are heated such that the dynamic template gives rise to an array of silver nanostructures while leaving the gold nanostructures intact. The end result is a substrate covered with an interpenetrating array of gold and silver nanostructures. FIG. 15 shows an SEM image which is a proof-of-principle demonstration of this multistep fabrication route. Clearly visible are two arrays composed of smaller (gold) and larger (silver) structures. To make the result more visible, and to show the versatility of the system, the two arrays are skewed by 16° relative to each other. In a practical embodiment, it is more likely that parallel arrays would be useful.

The preliminary results shown in FIG. 15 establish the ability to form interpenetrating arrays of two dissimilar materials through sequential processing as illustrated by FIG. 14. If such structures can be produced in close proximity to each other then the processing technology becomes relevant to a whole host of nanoscale coupling phenomena. A key demonstration is the ability to form a pedestal over an existing nanostructure without its disrupting subsequent dynamic assembly processes or its being destroyed, damaged or contaminated. If such pitfalls are avoided, as preliminary results suggest, then a new capability will be established.

Our present expectation is that this will work for a wide variety of cases. In general, the least volatile material (i.e. lowest vapor pressure) will have to be deposited first. A case which could be problematic is where the pedestal material used in the second step is different from that used in the first step and where the second pedestal material reacts with the particles produced in the first step. A possible example (not yet tried) would be nickel structures produced with bismuth pedestals and then exposed to antimony pedestals in step 2. Under those circumstances it would not be surprising if nickel structures absorbed significant quantities of antimony as nickel has already shown this tendency when using bismuth/antimony pedestals.

This sequential capability could also be used to create arrays that are progressively denser just by repeating the process over and over again with the shadow mask offset by a calculated fraction of the repeat distance. Accomplishing this using photolithography with appropriate alignment markers should be fairly straightforward.

This process has been found to work even for combinations, such as an antimony sacrificial layer in the second stage over gold placed in the first stage, where a eutectic may be expected to form. That is illustrated by the silver/gold array in FIG. 15, in which it is apparent that many of the first-stage gold structures would have had to have been covered in antimony in the second stage, because of the placement and alignment of the second-stage shadow mask. It is presently thought that the antimony-covered gold structures will absorb antimony, possibly forming the eutectic composition, and then subsequently lose the antimony to sublimation. Issues may, however, arise as the gold nanostructure size is reduced. In particular, it is possible that small nanoparticles might move due to the influence of the antimony overlayer. If this does not occur it allows for dense array formation, but if it does occur it may be possible to utilize this effect in a controlled manner to bring nanoparticles into close proximity. In experiments with palladium on bismuth pedestals, we have observed that palladium structures become mobile at high temperatures, making it difficult to form an array. Our current hypothesis is that the rapid loss of bismuth from the structure upon cooling renders the structure mobile, possibly because of reactive dewetting.

With appropriate alignment markers it should also prove possible to form interpenetrating arrays where the two nanostructures are placed in close proximity to each other. Such a configuration has practical uses: the palladium-gold nanoparticle combination in close proximity has already been demonstrated as a gas sensing system with remarkable sensitivity[46]. The formation of interpenetrating arrays where two plasmonic nanoparticles are in close proximity is also of significance due to coupling phenomena. These particles can be identical or different both in terms of size and composition.

The repeated dynamic templating process could also be used to make three-dimensional array structures. For example, create a first array, deposit an insulating layer over the array, create a second array, and repeat to a desired height. That process should in most cases be easier than the two-dimensional interpenetrating array, because the insulating layer will protect the previous array from interaction with the materials used in the subsequent dynamic templating process. The field of photonic crystals is based on the formation of such arrays.

It should also be possible to create a pattern on the substrate surface which is the inverse (or the negative) of the pattern created using dynamic templating. For example, one embodiment of a process to create a nanohole array would proceed by first forming an array of structures of one material (e.g. silver), where the contact angle with the substrate is greater than 90°, so that the structures are more than a hemisphere. That would be followed by the deposition of a continuous film of a second material (e.g. gold) over the array and exposed substrate where the adatom flux forming the film is at normal incidence to the substrate and where the film thickness is significantly less than the radius of the structures forming the array. Such a deposition would leave the base of the arrayed structures exposed, because both they and an immediately surrounding area of the substrate would be shadowed by the curvature of the array. The subsequent exposure of these exposed areas to an etchant (e.g. nitric acid) that preferentially attacks the array structure while leaving the film unscathed will send both the array structures and their film coating into solution leaving behind a film with an array of holes on the substrate surface. Metallic films patterned in this manner are of significance to plasmonic waveguide applications.

Figure 16:
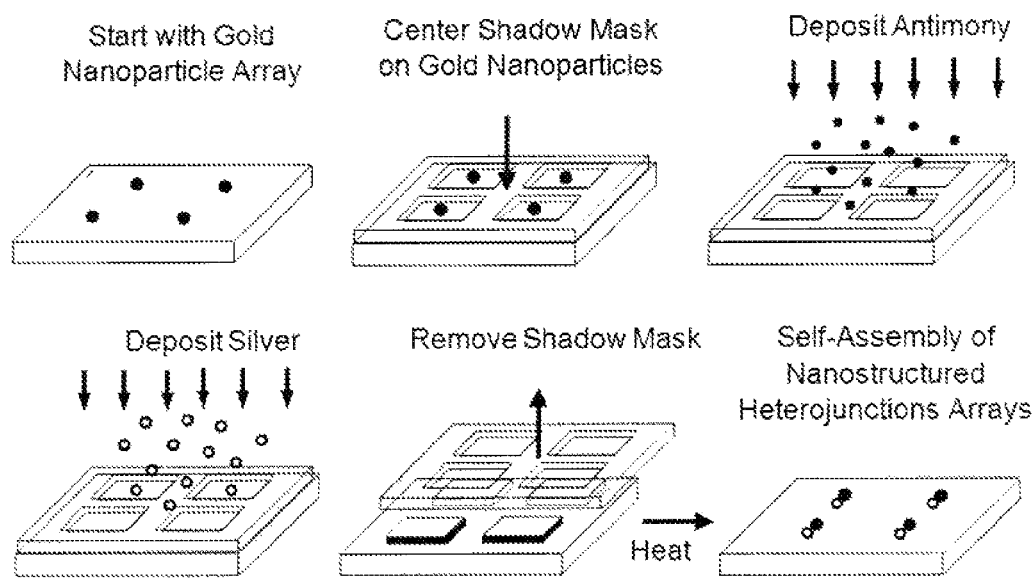
FIG. 16 is a set of schematics showing a process to fabricate heterojunction arrays.
Figure 17:
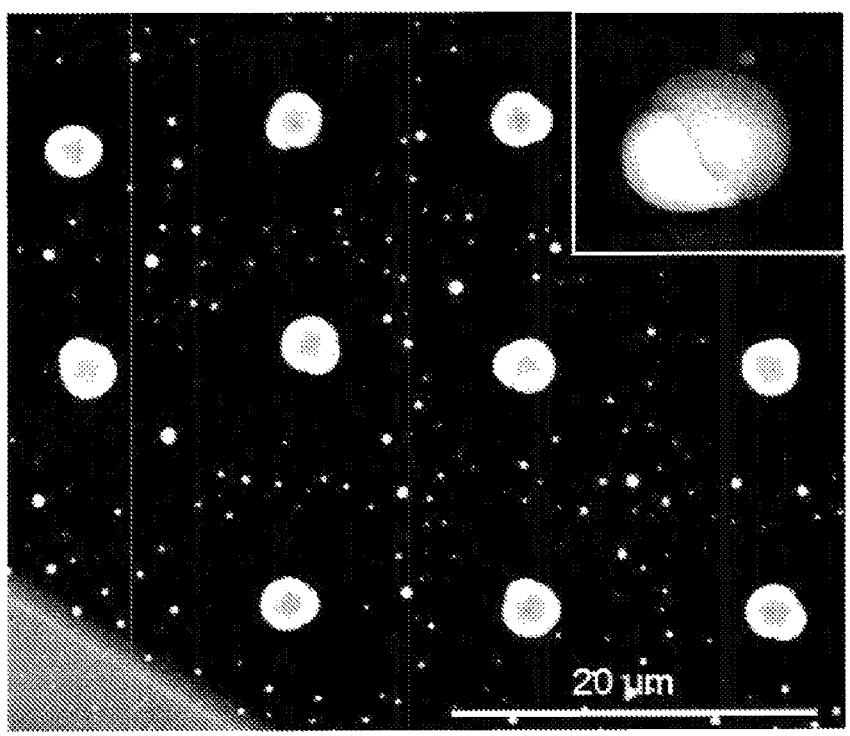
FIG. 17 is an SEM backscattering image showing Au—Ag heterostructures.

FIG. 16 shows a schematic of a processing route leading to the formation of arrays of nanostructured heterojunctions. The route is identical to that shown in FIG. 14 except that the lateral mask position remains identical for both gold and silver. In this scenario, the antimony pedestal for dynamic templating of the silver is grown over a previously formed gold-nickel structure, formed using a different templated assembly technique as described by Sundar et al. in Mater. Lett. 76, 155-158 (2012)[40]. When heated, the dynamic template drives silver diffusion to the exact position where the gold structure was initially formed. The two metals then merge to form a single structure, but where the gold-nickel and silver portions remain distinct. FIG. 17 shows an SEM backscattering image obtained from such an array. The different technique used involves a nickel mesh, which can remain in place until the silver has been deposited, facilitating the accurate alignment of the gold and silver arrays. However, the large number of non-array particles visible in FIG. 17 shows that the nickel grid technique is less satisfactory than the present methods.

This demonstration, while admittedly crude, demonstrates the possibility of bringing together two materials to the same location. This corroborates the feasibility of using dynamic templating to form heterojunctions, core-shell structures or stacked nanostructures. It may also be possible to bring two materials together to form a compound, or to supply a gold seed with a precise amount of a second material to form a nanowire through the vapor-liquid-solid growth mode[47]. Such capabilities would advance this processing route beyond the formation of individual structures towards the assembly of actual devices on the substrate surface.

Dewetting of continuous films can also be used to alter the size and average spacing of the nanostructures. For numerous applications, array formation is not a requirement. The placement of a metal or other structural material on a continuous layer of antimony or other sacrificial material followed by its subsequent dewetting can then be of technological relevance even if a shadow mask is not used. Typically, the nanostructures produced are then not in arrays, but instead are randomly spaced and have a size distribution.

The process proceeds in much the same way as for the templated case except that it is now reliant on random fluctuation to break up the metal layer, and is radically altered, compared with conventional dewetting, by the concurrent sublimation of the sacrificial antimony layer introduced between the substrate and the noble metal overlayer. In contrast with conventional dewetting, where the thickness of the deposited metal film determines the characteristic lengthscales of the assembly process, it is the thickness of the antimony or other sacrificial layer that dictates the nanoparticle size and the interparticle spacing. The result is a far more flexible self-assembly process, because the nanoparticle size and areal density can be varied widely. Demonstrations show nanoparticle areal densities that are varied over four orders of magnitude assembled from the identical gold layer thickness, where the accompanying changes to nanostructure size see a systematic shift in the wavelength of the localized surface plasmon resonance. As a versatile self-assembly process, it offers the opportunity to tailor the properties of an ensemble of nanostructures to meet the needs of specific applications.

This embodiment of the procedure used to obtain substrate-supported gold nanoparticles begins with the deposition of a sacrificial antimony layer, over which an ultrathin gold layer is deposited. Heating the layered structure results in the agglomeration of gold, but the dewetting is strongly influenced by the concurrent sublimation of antimony. At the end of the process all the antimony has sublimed, leaving immobilized gold nanoparticles on the surface of the substrate. Experiments were carried out on (0001)-oriented $Al_2O_3$ substrates (i.e. c-plane sapphire). This surface is attractive for such studies because of its low surface energy, high chemical and thermal stability, crystallographic perfection and high resistance to gold and silver interdiffusion. This substrate is also optically transparent, which allows for the straightforward characterization of the plasmonic response.

The dewetting characteristics of gold on sapphire in the absence of a sacrificial antimony layer were mapped out for film thicknesses ranging from 0.7 to 24 nm. Twenty-four samples were then used to characterize the influence of an antimony layer on the gold dewetting process. For this series of samples, four gold film thicknesses of 0.7, 2, 4 and 8 nm were each deposited on antimony layers having thicknesses of 2.5, 5, 7.5, 10, 20 and 40 nm. For silver dewetting experiments, a film thickness of 2 nm was deposited on a bare substrate and compared to silver deposited on antimony layers having thicknesses of 1.5, 3, 4.5 and 6 nm. All depositions were carried out in a Gatan High Resolution Ion Beam Coater using targets with 5 nines purity. The quoted film thicknesses are obtained using deposition rates derived from atomic force microscopy (AFM) measurements on the step-edges formed through the deposition of films through shadow masks. Films in groups of four, where each had the same antimony content, were placed in an alumina crucible and inserted into a tube furnace (Lindberg Blue M). Four quartz tubes dedicated to the dewetting of (i) gold, (ii) gold with antimony, (iii) silver and (iv) silver with antimony were used in order to prevent cross-contamination. All experiments were carried under a 100 sccm flow of ultra-high purity argon, and the tube was thoroughly flushed with argon prior to heating. All gold samples used a heating regimen which sees the sample ramped to 900° C. in 45 min where it is held for 15 min, after which it is allowed to cool to room temperature over the course of a few hours. Samples were then cycled to high temperatures a second time, a procedure which proved effective in ridding the sample of trace amounts of antimony. It is noted that the four samples having no antimony were also temperature cycled in order to obtain fair comparisons. Silver dewetting experiments were also carried out in a similar manner, but where the samples were heated to 750° C. in 30 min. The lower temperature prevented significant silver evaporation.

Figure 18:
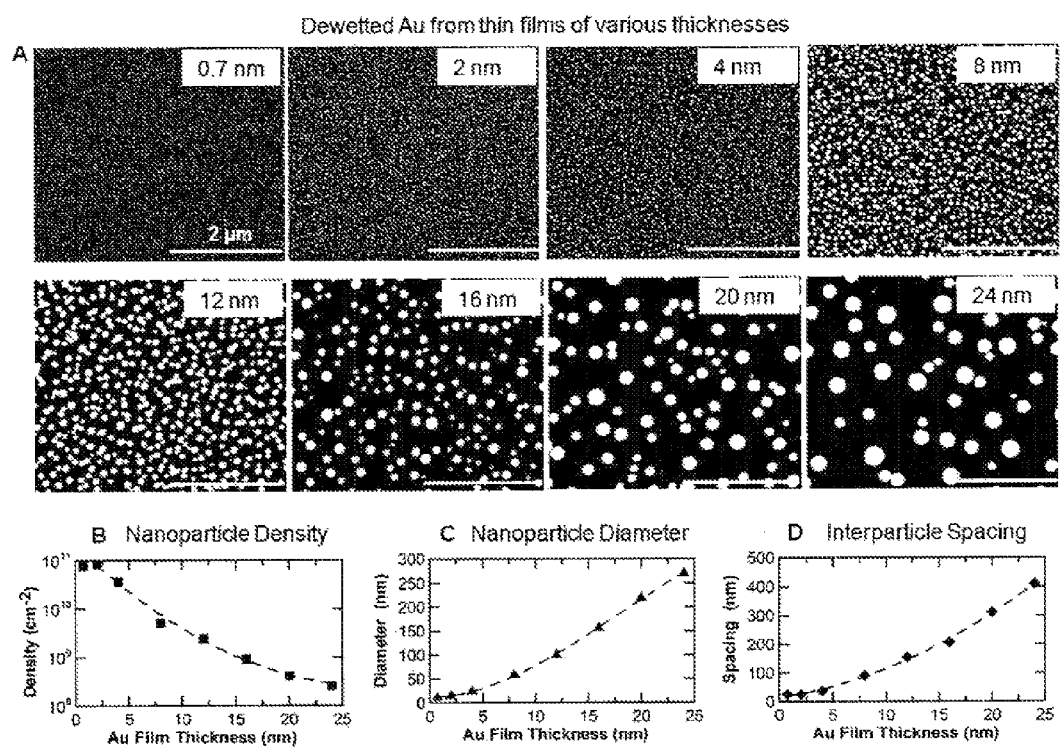
FIG. 18A is a set of SEM images of gold particles formed by conventional dewetting of gold films of various thicknesses on a sapphire substrate.
FIGS. 18B through 18D are graphs showing the trends of various properties against film thickness in FIG. 18A.

FIG. 18A shows SEM images of nanostructures derived from gold films of various thicknesses which have dewetted on sapphire substrates, without a sacrificial layer. The scale bars are 2 μm. Such images were used to extract the dependency of the nanoparticle areal density (FIG. 18B), the nanoparticle diameter (FIG. 18C) and the interparticle spacing (FIG. 18D) on the initial gold film thickness. Nanoparticle diameters and interparticle spacings were extracted from distributions where the plotted value is the histogram maximum. The interparticle spacing measurements correspond to the center-to-center nearest-neighbor distances. The overall dewetting behavior observed is consistent with previous studies and provides baseline parameters characteristic of the conventional dewetting process. As the gold film thickness is increased from 0.7 to 24 nm there is a nearly four order of magnitude decrease in the density (number per unit area) of nanoparticles which is accompanied by a corresponding rise in the nanoparticle diameter and interparticle distance. The overall process is, thus, characterized by agglomeration which occurs on increasingly larger length-scales as the gold layer thickness is increased. The assembly process, thus, yields either densely packed smaller structures or widely spaced larger structures. For a given film-substrate combination little can be done in terms of processing conditions to significantly alter this behavior.

Figure 19A:
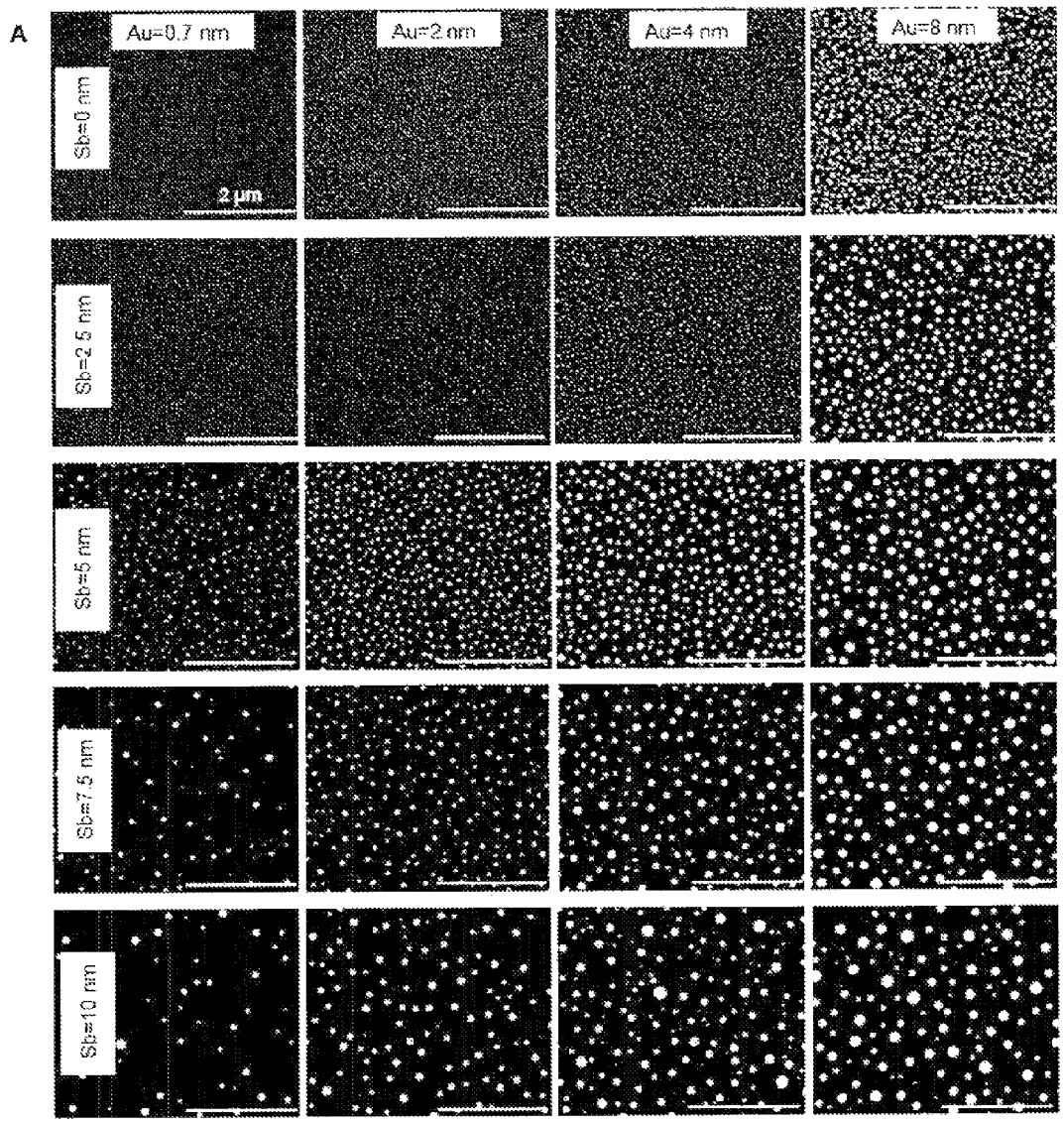
FIG. 19A is an array of SEM images of sub-micrometer gold structures formed from continuous Au on Sb layers of various thicknesses.
Figure 19B:
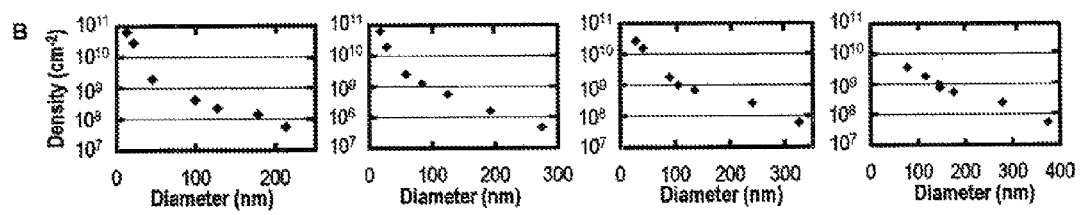
FIG. 19B is a set of graphs of particle density against diameter for each column in FIG. 19A.

FIG. 19A shows a matrix of SEM images which map out the influence that a sacrificial antimony layer has on the dewetting characteristics of ultrathin gold films. Each row in the matrix corresponds to a single antimony layer thickness, while each column corresponds to a single gold thickness. For any individual antimony thickness (i.e., any row of the matrix) the trend is for the nanoparticle size to increase as the thickness of the gold layer increases, a trend identical to that observed when gold films are deposited directly on a bare substrate. However, the previous trend toward larger and less densely spaced nanoparticles for thicker gold layers, while remaining intact for thin antimony layers, tends to disappear as the layer thickness is increased. Quite dramatic is the trend observed as the antimony thickness is varied while holding the gold thickness constant (i.e., down a single column of the matrix), showing a remarkable increase in both the nanoparticle size and interparticle spacing as the antimony thickness increases. These changes are accompanied by a nearly four order of magnitude change in the nanoparticle number density, plotted for each column in FIG. 19B.

Figure 20:
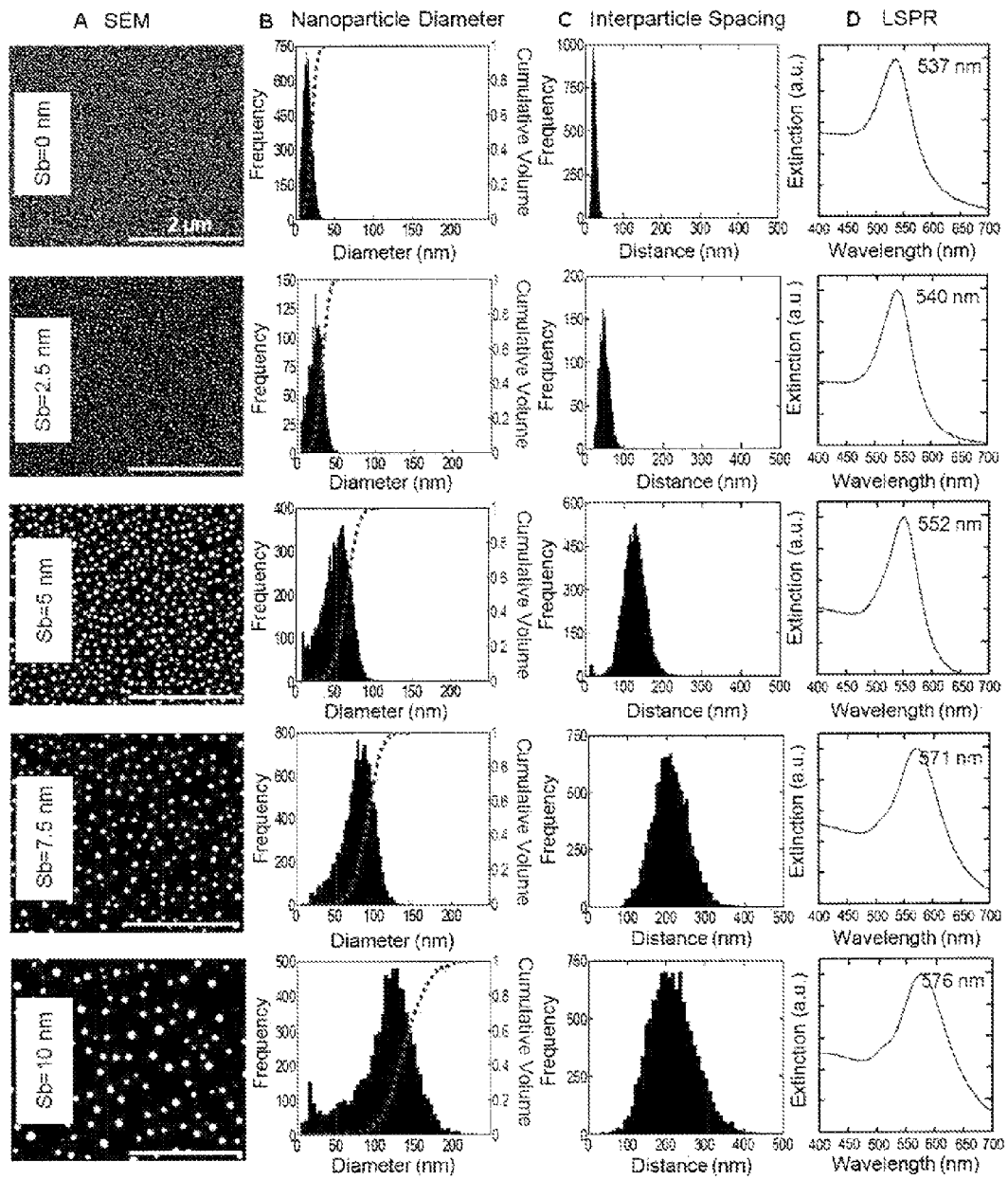
FIG. 20A through FIG. 20D are a set of SEM images corresponding to one column of FIG. 19A, with charts illustrating properties of each sample.

The observed trends continue well outside the extent of the matrix shown in FIG. 19A, ultimately giving rise to micrometer-scale diameter particles with interparticle spacings near ten micrometers. This ability to radically alter the nanoparticle size, spacing and density while maintaining a constant gold film thickness has not previously been demonstrated. To further illustrate this point, FIG. 20 shows the SEM images, histograms of the nanoparticle diameter (FIG. 20B, with cumulative curves superimposed) and interparticle spacing (FIG. 20C), and spectra of the extinction efficiency (FIG. 20D) for 2 nm thick gold films dewetted on antimony layers of various thicknesses (0, 2.5, 5, 7.5, and 10 nm). The scale bars in FIG. 20A are 2 µm. The frequency plotted in the histograms and cumulative curves of FIGS. 20B and 20C is a count of the number of times each diameter or distance was observed in the SEM images analyzed. Evident is a systematic shift in the distributions from smaller to larger nanoparticle diameters and from closely to sparsely spaced nanoparticles as the thickness of the sacrificial antimony layer is increased. Quite expectedly, the extinction efficiency shows a corresponding red-shift in the wavelength of the localized surface plasmon resonance (LSPR) resulting from the larger nanoparticles assembled (FIG. 20D).

Figure 21:
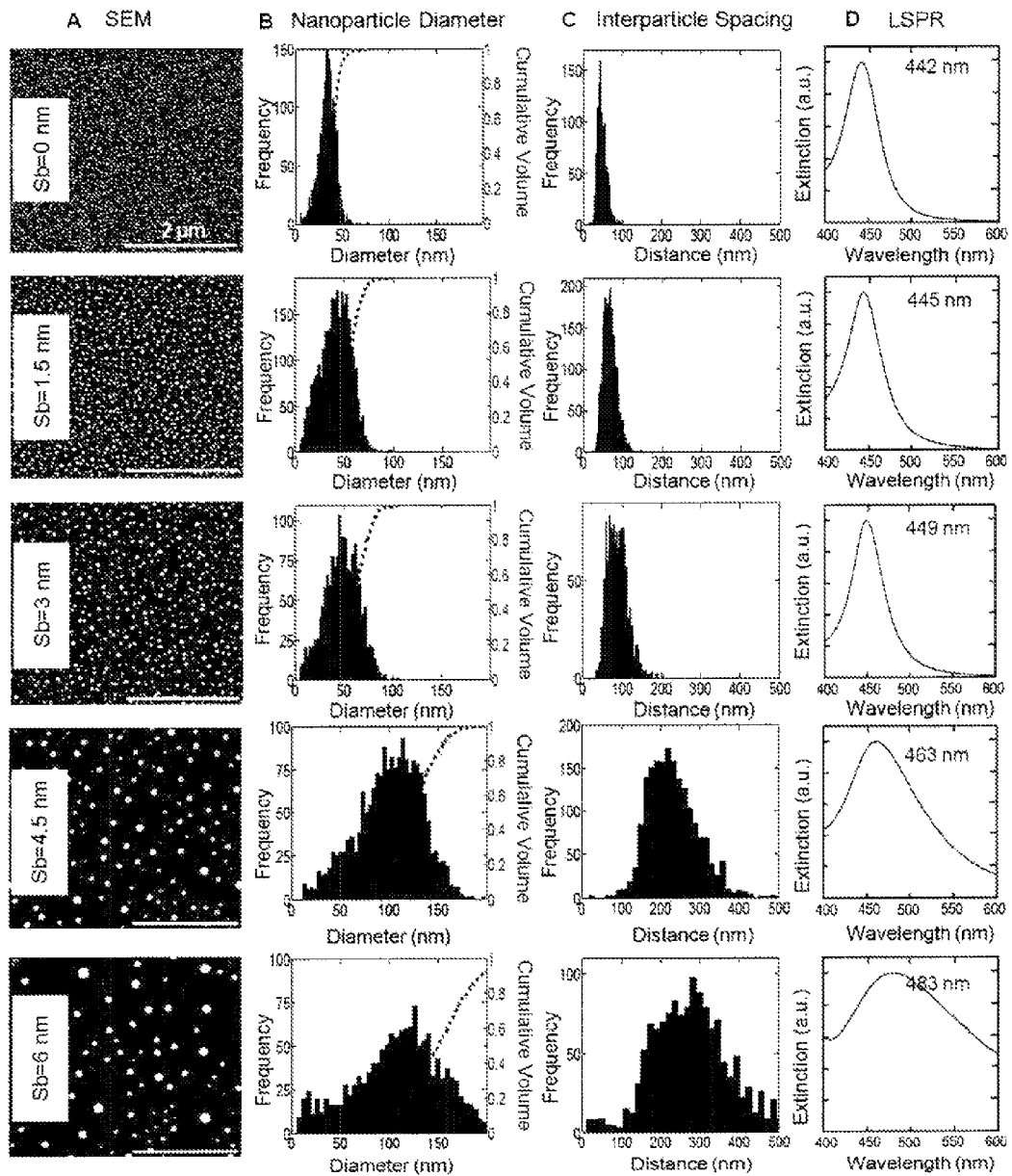
FIG. 21A through FIG. 21D are a set of SEM images and charts similar to FIG. 20 for silver samples.

Silver nanoparticles were also assembled on sapphire substrates using a sacrificial antimony layer. FIG. 21 shows, similarly to FIG. 20, the SEM images, histograms of the nanoparticle diameter and interparticle spacing, and spectra of the extinction efficiency for 2 nm thick silver films dewetted on antimony layers of various thicknesses. In a manner quite similar to gold nanoparticle assembly, there is a systematic increase in the nanoparticle diameter and interparticle spacing as well as a red-shift in the LSPR peak position as the antimony layer thickness is increased. There are, however, a number of noticeable differences. First, silver agglomerates over a larger characteristic length-scale than gold. Second, there is a discontinuity in the trends for nanoparticle size and interparticle spacing as the antimony layer thickness transitions from 3 to 4.5 nm. The silver nanoparticles also show a stronger tendency to facet.

A significant advantage of introducing antimony (or bismuth) into the dewetting process is that it allows for much greater control over the size and spacing of the nanostructures produced. In conventional dewetting, where only a gold layer is deposited and then heated, as shown in FIG. 1, smaller nanostructures are obtained by decreasing the film thickness. This, however, yields nanostructures which are closely packed and there is little that can be done to change that situation using existing practices. By varying the relative thicknesses of antimony and gold in the dynamic templating process, however, it should be possible to vary separately the size and the spacing of the nanostructures (more antimony giving a wider spacing, more gold giving larger particles). FIG. 22 shows the different dewetting characteristics obtained using the same amount of gold, 0.8 monolayers, but where the amount of antimony was 6.5 nm in FIG. 22A and 32.5 nm in FIG. 22B. FIG. 22 shows AFM images and corresponding cross-sections for randomly spaced gold nanoparticles in each case. Note the large difference in scale. The AFM image in FIG. 22A is 5 µm wide, that in FIG. 22B is 10 µm wide, so that FIG. 22A covers only ¼ of the area in FIG. 22B. The nanoparticles for the thick antimony layer are larger and more widely spaced. This embodiment could prove important to solar cell applications where the efficiency is enhanced with plasmonic nanoparticles.

An examination of the literature shows poor dewetting characteristics for metals on silicon. The particles formed are poorly shaped (often ellipsoidal) and have larger size distributions than are achieved on other substrates. Because of that poor quality other, more expensive, procedures are being used to create and attach plasmonic particles on silicon. It is believed that the dynamic templating process can produce results far superior to conventional dewetting, both in terms of tuning the particle size and spacing and in the formation of well-shaped hemispherical nanoparticles.

A narrower size distribution may be desired than in FIG. 22, but a positioning that is random, or at least need not be a uniform array, may be acceptable. That may be achieved by introducing pedestal-like structures, but with more emphasis on fairly uniformly sized pedestals than on their regular positioning. The end result would then be the formation of randomly (or at least unevenly) spaced particles all of similar size. It may be possible to use mechanical stamping to imprint a continuous layer (e.g. nanoimprinting) or to use a self-assembled layer with randomly spaced nano-scale openings as a shadow mask. It may also be possible to use the quasiperiodic, uniformly sized nano-scale openings in anodic alumina oxide (AAO) membranes as shadow masks.

It is also possible to form an array and then surround it with smaller randomly spaced nanoparticles. This could also have applications in plasmonically enhanced solar cells. One embodiment of such a procedure would be to form a gold array using the process shown in FIG. 3. A thin layer of antimony would then be deposited which covers the entire surface including the gold structures. That would be followed by a thin layer of gold. When heated, the initial gold array would remain while the deposited layers would assemble to form randomly spaced nanostructures around the larger structures forming the array.

Figure 23:
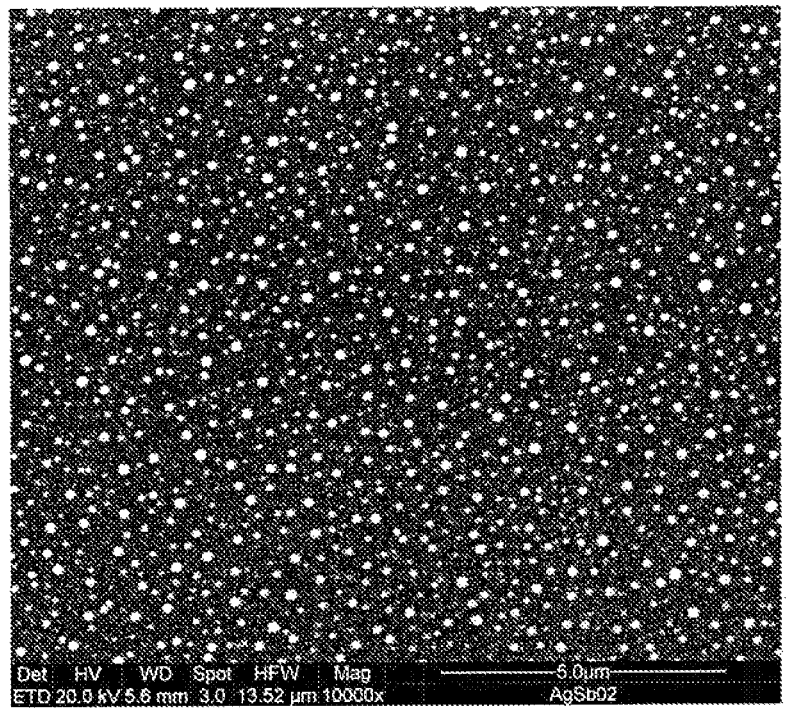
FIG. 23 is a micrograph of randomly spaced silver nanoparticles formed using a dynamic template.

Referring to FIG. 23, the placement of a continuous sacrificial layer between the substrate and material to be dewetted also allows for the dewetting of film-substrate combinations for processing conditions that do not readily support the dewetting phenomenon. For example, conventional dewetting simply did not work for silver on a sapphire substrate in a vacuum environment. That is possibly because the silver bonds strongly to the sapphire, so that with increasing temperature the silver sublimes before it becomes sufficiently mobile to dewet. Some dewetting was obtained in an argon atmosphere, which may inhibit the sublimation. By incorporating antimony into the process the films dewetted to produce randomly spaced silver nanoparticles, as shown in FIG. 23. This demonstrates that embodiments of the present invention can be used to induce dewetting for film-substrate combinations where the dewetting phenomenon would otherwise prove difficult.

As explained with reference to FIG. 9 for the case of pedestals, enhanced dewetting using eutectics is not reliant on the placement of the material to be dewetted on top the sacrificial layer. Enhancements were observed irrespective of the way the end material was incorporated into the pedestal (e.g. top, bottom, middle, mixed in). Similar changes could provide a means to further manipulate the dewetting process of FIG. 23.

It is also expected that using a sacrificial layer not only can enhance the dewetting phenomenon, but also can significantly reduce the temperature at which dewetting occurs. That is especially important for high melting point materials like nickel, cobalt, platinum and palladium. For the case of gold and silver, this lowering of the temperature is not as important because we need to heat the samples to elevated temperatures to remove the antimony or bismuth. If, however, other sacrificial materials with high vapor pressure at lower temperature prove effective then this could prove useful for creating gold and silver structures on semiconductor surfaces such as GaAs and Ge. This is because sufficiently low temperatures will avoid interdiffusion of gold and silver into the semiconductor layers.

Figure 24A:
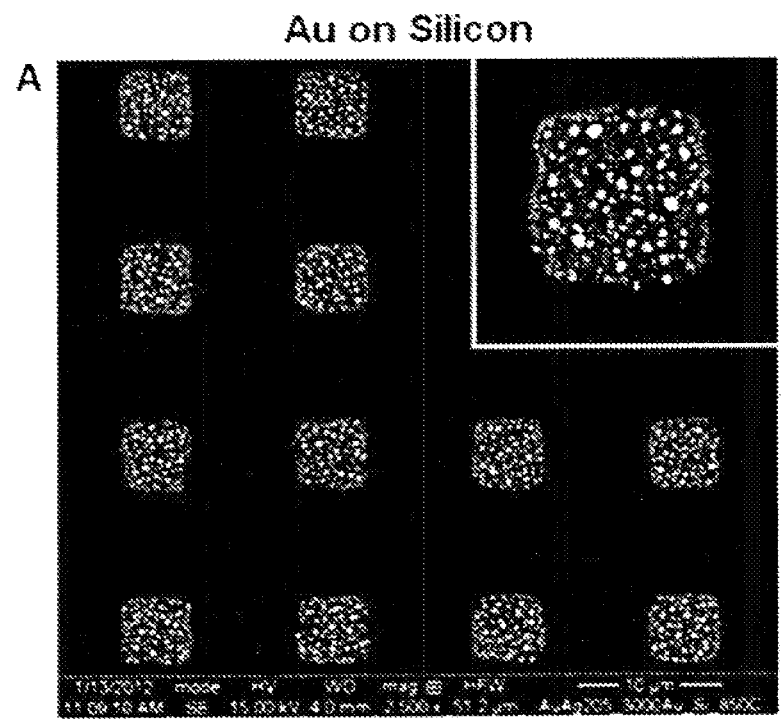
FIGS. 24A and 24B are SEM images showing a comparison of the silicon surface obtained when gold agglomerates using (a) conventional dewetting and (b) dynamic templating.

Referring to FIG. 24, conventional dewetting of gold on silicon tends to cause severe damage to the surface of silicon. FIG. 24A shows SEM images of the agglomeration which results from the placement of gold directly on silicon. The inset is an enlargement of one square of the array. It is striking how much damage the gold does to the silicon surface when gold is placed directly on it. The damage is due to the melting and resolidification associated with the silicon-gold eutectic.

Figure 24B:
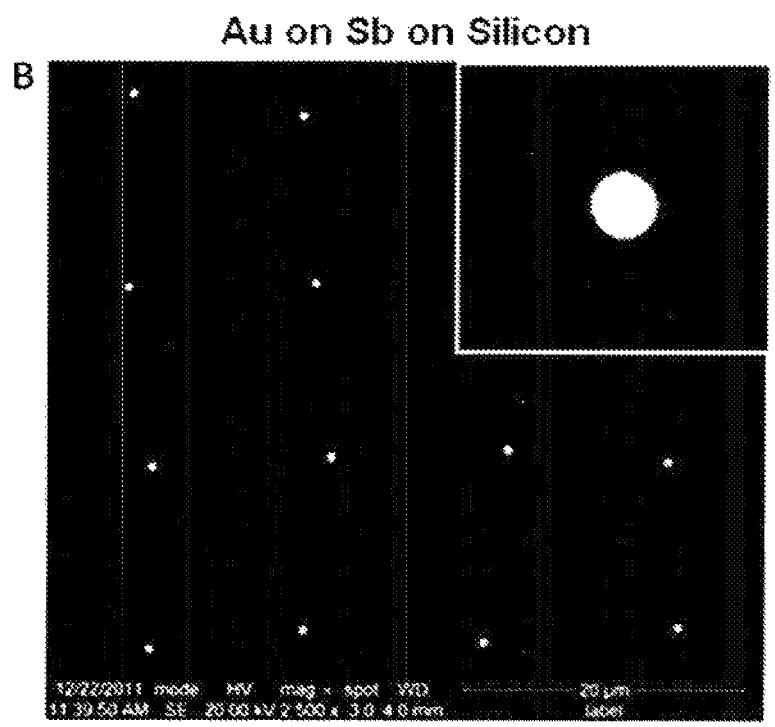

In remarkable contrast, FIG. 24B shows that dynamic templating of gold can be effected using an antimony pedestal on silicon without severely damaging the surface of the silicon. Not only has the gold successfully agglomerated into a single nanoparticle for each cell of the array; no damage to the silicon surface is apparent. Similar embodiments allow for dewetting of other nanostructure-substrate combinations that have previously proved difficult, e.g. silver-sapphire and germanium-sapphire.

In particular, conventional dewetting requires that the film be of higher surface energy than the substrate. This, however, is not necessarily a requirement for dynamic templating where the nanostructure forms out of contact with the substrate material. It should, therefore, prove possible to assemble arrays by dynamic templating from substrate/film combinations (e.g., where the surface energy of the substrate is greater than the surface energy of the nanostructure) that would be difficult or impossible using conventional dewetting. One potential problem is that the structure formed could disassemble when it makes contact with the higher surface energy substrate surface. It is likely that in certain instances that can be mitigated either by conducting assembly at temperatures which are insufficient to allow wetting, or by reducing the temperature just before the pedestal finally disappears. The sapphire-germanium combination may actually be such a case, but it is difficult to unequivocally establish this as published surface energies for sapphire vary widely.

The patterned features created in the present examples are generally three-dimensional in nature (In most examples they are approximately hemispherical particles.) and can be highly crystalline due to the epitaxial relationship shared with the substrate. A higher degree of crystallinity has been shown to significantly improve the optical properties of plasmonic nanostructures.

A hybrid route incorporating the present invention and conventional lithography techniques should yield superior results and produce high densities of nanostructures in appropriate cases. There are also numerous unconventional, or at least less conventional, nanopatterning techniques which are being developed and, in some cases, being utilized commercially to pattern sub-micrometer scale feature sizes. These routes typically utilize either (i) a patterned surface as a stamp which imprints the desired texture or (ii) a pattern with sub-micrometer openings which allow an incident flux of material to pass through to a substrate in the location of the openings. Some techniques of significance that fall under these categories are nanoimprint lithography, soft lithography, nanosphere lithography, stencil lithography and porous templating (e.g. anodic aluminum oxide—AAO).

Embodiments of the invention have relevance to applications utilizing substrate-based structures both on sub-micrometer and nanometer length-scales. With fabrication routes already demonstrated for plasmonic materials, magnetic materials, metals, alloys and semiconductors the range of potential applications is quite broad. Listed below are some possibilities:

1. Biological[48], chemical[46] and light sensors[49]
2. Photovoltaics (plasmonic enhancement agents, semiconductor pn-junctions)[33]
3. Magnetic memory[50]
4. Light emitting devices[51] including those based on quantum confinement effects
5. Nanoscale electronics[52]
6. Metal contact arrays for electronics
7. Catalytic seeds for nanowires[53] (carbon nanotubes, semiconductors and metals) and other more intricate nanostructures
8. Plasmonics[54], including plasmonic metamaterials[55]
9. Photonic crystals[56]
10. Plasmonic Waveguidess[57]
11. Micro- and nano-electromechanical Systems (MEMS)[58]
12. Masks for reactive-ion etching (RIE)
14. Catalysis[59]

EXAMPLES

The following Examples illustrate the invention.

Example 1

Gold on (0001)-Oriented Sapphire Using Antimony Pedestal

A sapphire substrate with a (0001)-orientation, obtained from a commercial vendor (MTI Corporation), was cut to size (8 mm×8 mm×0.5 mm) and then cleaned in an ultrasonic bath using common solvents (methanol, acetone, isopropanol). A shadow mask was mechanically clamped over the substrate surface and then mounted onto the sample holder assembly in a pulsed laser deposition (PLD) chamber (Neocera Pioneer 120). The shadow mask consisted of an electroformed nickel mesh (Precision Eforming) with 5 μm×5 μm square openings and a repeat spacing of 12.5 μm. The exposed mesh area had a diameter of 5 mm. The deposition chamber was then evacuated to a base pressure of $10^{-7}$ torr. Mounted on the target carousel of the deposition chamber were 1" (25 mm) diameter targets of antimony (Kurt J. Lesker) and gold (Alfa Aesar). Antimony was first deposited through the mask using PLD.

Pulses from an excimer laser (Lambda Physik Compex 102 excimer laser, λ=248 nm, laser energy density=2 J/cm², laser spot size=4 mm×1.4 mm, laser repetition rate 10 Hz, substrate-target distance=8 cm) were used to vaporize the target material. The antimony pedestal was obtained using 7500 laser pulses and had a height of 300 nm. This deposition was immediately followed by a gold deposition of 0.75 nm obtained using 1000 laser pulses. Both depositions were carried out at room temperature with a target rotation speed of 20°/sec. The sample was then removed from the deposition chamber and the mask was removed leaving gold coated antimony pedestals on the substrate surface. After inspection under an optical microscope to confirm that the pedestal structures consisted of well formed arrays, the sample was placed in an alumina crucible. The crucible was then placed in a tube furnace under a 100 standard cubic centimeters per minute (sccm) flow of ultra-high purity argon. After flushing the tube with argon for 30 min the furnace temperature was ramped to 600° C. in 9 min where it was held for 30 min. The temperature was then ramped to 1070° C. in 16 min after which the furnace was turned off and the sample was allowed to cool to room temperature over the span of a few hours. The array of sub-micrometer gold structures shown in FIG. 4 was formed.

Example 2

Silver on (0001)-Oriented Sapphire Using Bismuth Pedestal

The procedure was the same as Example 1, except as follows. The targets mounted on the target carousel of the deposition chamber were 1" diameter targets of bismuth and silver (Alfa Aesar). Bismuth was first deposited. A pedestal height of 480 nm was obtained using 7500 laser pulses. This deposition was immediately followed by a silver deposition of 0.36 nm obtained using 100 laser pulses. The tube furnace temperature was ramped to 750° C. in 13 min where it was held for 10 min after which the furnace was turned off and allowed to cool to room temperature. The array of sub-micrometer silver structures shown in FIG. 5 was formed.

Example 3

Two-Layer Template

The procedure was the same as Example 1, except as follows. The targets mounted on the target carousel of the deposition chamber were 1" diameter targets of antimony (Kurt J. Lesker), gold (Alfa Aesar) and silver (Alfa Aesar). The substrate used was (100) $MgAl_2O_4$. The pedestal consisted of 300 nm of antimony topped with 4 nm of silver. This deposition was immediately followed by a gold deposition of 3 laser pulses using a laser power of 1.5 J/cm$^2$. When the mask was removed, a sub-monolayer of gold was left on the surface of each silver/antimony pedestal. The tube furnace temperature was ramped to 600° C. in 9 minutes where it was held for 30 min. The temperature was then ramped to 900° C. in 11 min to sublime the silver, after which the furnace was turned off and the sample was allowed to cool to room temperature. The array of nanometer-scale gold structures shown in FIG. 6a was formed. Because of the very small size of the nanoparticles, and the very small quantities of gold involved, it was not possible to determine whether all the gold deposited ends up in the nanoparticle because our thickness calibrations for the gold layer initially deposited are not accurate enough to determine these sub-monolayer values. The assembled material was equivalent to 1/500 of a monolayer. We would not have been able to detect if an additional 1/500 of a monolayer existed as dispersed atoms on the substrate surface or material that had sublimed.

The preceding description of the presently contemplated best mode and other embodiments of practicing the invention is not to be taken in a limiting sense, but is made merely for the purpose of describing certain general principles of the invention. Variations are possible from the specific embodiments described. For example, in the embodiments the sublimation of antimony or bismuth has been used primarily as a way of dynamic templating of gold or other final material. However, the fact that as little as a monolayer of gold can inhibit the sublimation of antimony has other applications. It not only provides a means to inhibit sublimation, but also could be used to direct diffusion processes towards particular directions, especially if the shadow mask used for applying the cap layer is slightly different, or is offset slightly, from the shadow mask so that some but not all of the side face of the pedestal is covered with the gold or other cap material. Another possibility is that a U or V-shaped pedestal might produce half its total vapor emission in a fairly narrow stream through the mouth of the U or V. If forming a nanoparticle or other structure of the cap material is not the primary objective, the process may be generalized to placing a low vapor pressure material on top of a high vapor pressure material, where the two materials are immiscible (at least over the time scale of the sublimation or evaporation) and are otherwise compatible.

The embodiments describe arrays formed using shadow masks with square or round openings. Shapes other than round or square, and patterns other than a regular array, including single structures and non-symmetric and more complex patterns and structures, are possible and could prove interesting and useful. For example, line-shaped pedestals could yield nanorods or could be caused or allowed to break up into two structures that are in close enough proximity to show nanostructure coupling phenomena. Pedestals defined by lithography or other imaging processes could also be designed to break up into many structures in an organized and controllable manner.

In all the described embodiments, the substrates are flat and planar. However, no reason is presently seen why this technique would not work on surfaces having more complex shapes, provided the surface is relatively smooth on length-scales similar to that of the base of the pedestal.

All of the embodiments describe using antimony or bismuth as the primary pedestal material. It is likely arsenic can be used as a pedestal material, because it is in the same column of the periodic table as bismuth and antimony. It is believed that other elements, such as Sb, Te, Cd, Zn and Pb, or compounds prone to sublimation, such as CdTe or $Bi_2Te_3$, may also serve. Te, Cd and Zn offer the possibility of performing the dynamic templating at lower temperatures, which is important for limiting diffusion into the substrate with some substrates and cap materials. Other elements, including Ag, In, Sn, Cu, Al, and even Pd, and compounds including CdTe and $Bi_2Te_3$, may also be useful. Silver could easily be effective as a one-layer pedestal material especially for high melting point solids. Palladium could be useful as a pedestal material for creating arrays of refractory metals. Alloy mixtures, including alloys of two or more of the above-mentioned elements, are also an interesting possibility. It is, however, harder to predict what will happen in the case of an alloy because its two or more components do not necessarily sublimate congruently.

Although distinct embodiments have been described and shown in the several drawings, features from different embodiments may be combined in a single embodiment.

Accordingly, reference should be made to the appended claims, rather than to the foregoing specification, as indicating the scope of the invention.

REFERENCES

The following references are incorporated herein by reference in their entirety.

[1] R. R. Dammel, F. M. Houlihan, R. Sakamuri, D. Rentkiewicz, A. Romano, 193 nm immersion lithography—Taking the plunge, *J. Photopolm. Sci. Tec.* 17, 587-601 (2004).

[2] T. Watanbe, H. Kinoshita, Current status and prospect of extreme ultraviolet lithography, *J. Photopolm. Sci. Tec.* 21, 777-784, (2008).

[3] C. Cheng, R. H. Lipson, Interference lithography: A powerful tool for fabricating periodic structures' *Laser Photonics Rev.* 4, 568-580, (2010).

[4] C. G. Wilson, A decade of step and flash imprint lithography, *J. Photopolm. Sci. Tec.* 22, 147-153 (2009).

[5] J. A. Rogers, H. H. Lee, Unconventional nanopatterning techniques and applications, John Wiley and Sons, Hoboken, N.J. (2009).

[6] G. L. Jay, Nanoimprint lithography: Methods and material requirements, *Adv. Mater.* 19, 495-513 (2007).

[7] Y. N. Xia, G. M. Whitesides, Soft lithography, *Annu. Rev. Mater. Sci* 28, 153-184 (1998).

[8] K. Y. Suh Y. S. Kim, H. H. Lee, Capilliary force lithography, *Adv. Mater.* 13, 1386-1389 (2001).

[9] S. M. Seo, J. Y. Park, H. H. Lee, Micropatterning of metal substrate by adhesive force lithography, *Appl. Phys. Lett.* 86, 133114 (2005).

[10] M. R. Jones, K. D. Osberg, R. J. Macfarlane, M. R. Langille, C. A. Mirkin, Templated techniques for the synthesis and assembly of plasmonic nanostructures, *Chem. Rev.* 111, 3736-3827 (2011).

[11] C. R. Henry, Morphology of supported nanoparticles, *Prog. Surf. Sci.* 3-4, 92-116 (2005).

[12] F. Silly, M. R. Castell, Bimodal growth of Au on $SrTiO_3$ (001), *Phys. Rev. Lett.* 96, 086104 (2006).

[13] G. A. Devenyi, J. Li, R. A. Hughes, A.-C. Shi, P. Mascher, J. S. Preston, The epitaxially driven formation of intricate supported gold nanostructures on a lattice-matched oxide substrate, *Nano Lett.* 9, 4258-4263 (2009).

[14] F. Silly, M. R. Castell, Temperature-dependent stability of supported five-fold twinned copper nanocrystals, *ACS Nano* 3, 901-906 (2009).

[15] S. J. Henley, J. D. Carey, S. R. P. Silva, Pulsed-laser-induced nanoscale island formation in thin metal-on-oxide films, *Phys. Rev. B* 72, 195408 (2005).

[16] F. Silly, M. R. Castell, Selecting the shape of supported metal nanocrystals: Pd huts, hexagons, or pyramids on $SrTiO_3$(001), *Phys. Rev. Lett.* 4, 046103 (2005).

[17] A. L. Giermann, C. V. Thompson, Requirements for graphoepitaxial alignment through solid-state dewetting of Au films, *J. Appl. Phys.* 109, 083520 (2011).

[18] A. L. Giermann, C. V. Thompson, Solid-state dewetting for ordered arrays of crystallographically oriented metal particles, *Appl. Phys. Lett.* 86, 121903 (2005).

[19] W. Kan, H. Wong, Fingering instability of a retracting solid film edge, *J. Appl. Phys.* 97, 043515 (2005).

[20] E. Jiran, C. V. Thompson, Capillary Instabilities in thin, continuous films, *Thin Solid Films* 208, 23-28 (1992).

[21] C. M. Müller, F. C. F. Mornaghini, R. Spolenak, Ordered arrays of faceted gold nanoparticles obtained by dewetting and nanosphere lithography, *Nanotechnology* 19, 485306 (2008).

[22] M. Ohring, Materials science of thin films, $2^{nd}$ Edition, Academic Press, San Diego (2002).

[23] J. Ye, C. V. Thompson, Templated solid-state dewetting to controllably produce complex patterns, *Adv. Mater.* 23, 1567-1571 (2011).

[24] F. Silly, M. R. Castell, Selecting the shape of supported metal nanocrystals: Pd huts, hexagons, or pyramids on $SrTiO_3$(001), *Phys. Rev. Lett.* 4, 046103 (2005).

[25] F. Silly, A. C. Powell, M. G. Martin, M. R. Castell, Growth shapes of supported Pd nanocrystals on $SrTiO_3$(001), *Phys. Rev B* 72, 165403 (2005).

[26] S. Hajjar, G. Garreau, L. Josien, J. L. Bubendorff, D. Berling, A. Mehdaoui, C. Pirri, T. Maroutian, C. Renard, D. Bouchier, M. Petit, A. Spiesser, M. T. Dau, L. Michez, V. L. Thanh, T. O. Mentes, M. A. Nino, A. Locatelli, Morphology and composition of Au catalysts on Ge(111) obtained by thermal dewetting, *Phys. Rev. B* 84, 123325 (2011).

[27] I. Beszeda, E. G. Gontier-Moya, A. W. Imre, Surface Ostwald-ripening and evaporation of gold beaded films on sapphire, *Appl. Phys A-Mater.* 81, 673-677 (2005).

[28] B. Q. Li, J. M. Zuo. Self assembly of epitaxial Ag nano-clusters on H-terminated Si(111) surfaces, *J. Appl. Phys.* 94, 743-748 (2003).

[29] F. Y. Lee, K. H. Fung, T. L. Tang, W. Y. Tam, C. T. Chan, Fabrication of gold nano-particle arrays using two-dimensional templates from holographic lithography, *Curr. Appl. Phys.* 9, 820-825 (2009).

[30] W. D. Wang, P. Schaaf, Two-dimensional nanoparticle arrays formed by dewetting of thin gold films deposited on pre-patterned substrates, *J. Mater. Sci.-Mater. El.* 8, 1067-1070 (2011).

[31] A. Sundar, R. A. Hughes, P. Farzinpour, S, Neretina. G. A. Devenyi, J. S. Preston, Manipulating the size distribution of supported gold nanostructures, *Appl. Phys. Lett.* 100, 013111 (2012).

[32] M. C. Plante, R. R. LaPierre, Growth mechanisms of GaAs nanowires by gas source molecular beam epitaxy, *J. Cryst. Growth* 286, 394-399 (2006).

[33] H. A. Atwater, A. Polman, Plasmonics for improved photovoltaic devices, *Nat. Mater.* 9, 205-213 (2010).

[34] J. Vuckovic, M. Loncar, A. Scherer, Surface plasmon enhanced light-emitting diode, *IEEE J. Quantum Electron.* 10, 1131-1144 (2000).

[35] Y. P. Zhang, B. Yang, P. P. Rugheimer, M. M. Roberts, D. E. Savage, F. Liu, M. G. Lagally, Influence of germanium on thermal dewetting and agglomeration of the silicon template layer in thin silicon-on-insulator, *J. Phys. D Appl. Phys.* 42, 175309 (2009).

[36] J. Basu, C. B. Carter, R. Divakar, B. Mukherjee, N. Ravishankar, Nanopatterning by solid-state dewetting on reconstructed ceramic surfaces, *Appl. Phys. Lett.* 94, 171114 (2009).

[37] D. Kim, A. L. Giermann, C. V. Thompson, Solid-state dewetting of patterned thin films, *Appl. Phys. Lett.* 95, 251903 (2009).

[38] F. Y. Lee, K. H. Fung, T. L. Tang, W. Y. Tam, C. T. Chan, Fabrication of gold nano-particle arrays using two-dimensional templates from holographic lithography, *Curr. Appl. Phys.* 9, 820-825 (2009).

[39] J. Ye, C. V. Thompson, Regular pattern formation through the retraction and pinch-off of edges during solid-state dewetting of patterned single crystal films, Phys. Rev. B 82, 193408 (2010).

[40] A. Sundar, C. J. Decker, R. A. Hughes, S, Neretina, The templated assembly of highly faceted three-dimensional gold microstructures into periodic arrays, *Mater. Lett.* 76, 155-158 (2012).

[41] S. K. Yang, F. Xu, S. Ostendrop, G. Wilde, H. Zhao, Y. Lei, Template-confined dewetting process to surface nanopatterns: Fabrication, structural tunability, and structure-related properties. *Adv. Funct. Mater.* 21, 2446-2455 (2011).

[42] W. R. Tyson, Surface free energy estimates of solid metals: Estimation from liquid surface tension measurements, *Surf. Sci.* 62, 267-276 (1977).

[43] Copel, M., Reuter, M. C., Kaxiras E. & Tromp R. M. Surfactants in epitaxial growth. *Phys. Rev. Lett.* 63, 632-635 (1989).

[44] de Miguel, J. J. & Miranda, R. Atomic aspects in the epitaxial growth of metallic superlattices and nanostructures. *J. Phys.-Condens. Mat.* 14, R1063-R1097 (2002).

[45] Swaminathan, P., Palmer, J. S. & Weaver, J. H. Competition between particle formation and burrowing: Gold on bismuth. *Phys. Rev. B* 78, 115416 (2008).

[46] N. Liu, M. L. Tang, M. Hentschel, H. Giessen, A. P. Alivisatos, Nanoantenna-enhanced gas sensing in a single tailored nanofocus, *Nature Mater.* 10, 631-636 (2011).

47 R. S. Wagner, W. C. Ellis, Vapor-liquid-solid mechanism of single crystal growth, *Appl. Phys. Lett.* 4, 89-90 (1964).

48 J. N. Anker, W. P. Hall, O. Lyandres, N. C. Shah, J. Zhao, R. P. Van Duyne, Biosensing with plasmonic nanosensors, *Nat. Mater.* 7, 442-453 (2008).

49 D. Bitauld, F. Marsili, A. Gaggero, F. Mattioli, R. Leoni, S. J. Nejad, F. Levy, A. Fiore, Nanoscale optical detector with single-photon and multiphoton sensitivity, *Nano Lett.* 10, 2977-2981 (2010).

50 B. D. Terris, Fabrication challenges for patterned recording media, *J. Magn. Magn. Matter.* 321, 512-517 (2009).

51 S. Pillai, K. R. Catchpole, T. Trupke, G. Zhang, J. Zhao, M. A. Green, Enhanced emission from Si-based light-emitting diodes using surface plasmons, *Appl. Phys. Lett.* 88, 161102 (2006).

52 A. DeHon, Array-based architecture for FET-based, nanoscale electronics, *IEEE Trans. Nanotech.* 80, 23-32 (2003).

53 K. A. Dick, A review of nanowire growth promoted by alloys and non-alloying elements with emphasis on Au-assisted III-V nanowires. *Prog. Cryst. Growth Ch.* 54, 138-173 (2008).

54 J. A. Schuller, E. S Barnard, W. Cai, Y. C. Jun, J. S. White, M. L. Brongersma, Plasmonics for extreme light concentration and manipulation, *Nat. Mater.* 9, 193-204 (2010).

55 H. T. Chen, W. J. Padilla, J. M. O. Zide, A. C. Gossard, A. J. Taylor, R. D. Averitt, Active terahertz metamaterial devices, *Nature* 444, 597-600 (2006).

56 C. Lopez, Materials aspects of photonic crystals, *Adv. Mater.* 15, 1679-1704, 2003.

57 S. A. Maier, Plasmonics-Towards subwavelength optical devices, *Curr. Nanosci.* 1, 17-23 (2005).

58 T. F. Marinis, The future of microelectromechanical systems (MEMS), *Strain* 45, 208-220 (2009).

59 Z. Ma, S. Dai, Development of novel supported gold catalysts: A materials perspective, *Nano Res.* 4, 3-32 (2011).

60 E. Dornel, J. C. Barbe, F. de Crecy, G. Lacolle and J. Eymery, Phys. Rev. B: Condens. Matter Mater. Phys., 2006, 73, 115427.

61 P. Farzinpour, A. Sundar, K. D. Gilroy, Z. E. Eskin, R. A. Hughes, S, Neretina, Dynamic Templating: A Large Area Processing Route for the Assembly of Periodic Arrays of Sub-Micrometer and Nanoscale Structures *Nanoscale,* 5, 1929-1938 (2013).

62 P. Farzinpour, A. Sundar, K. D. Gilroy, Z. E. Eskin, R. A. Hughes, S. Neretina, Altering the dewetting characteristics of ultrathin gold and silver films using a sacrificial antimony layer, *Nanotechnology* 23, 495604 (2012).

63 Thompson C. V., Solid-state dewetting of thin films, *Ann. Rev. Mater. Res.,* 42, 399-434 (2012).

64 T. P. Bigioni, X.-M. Lin, T. T. Nguyen, E. I. Corwin, T. A. Witten. H. M. Jaeger, Kinetically driven self assembly of highly ordered nanoparticle monolayers, *Nat. Mater.* 5, 265-270 (2006).

65 S. Biswas, S. Gawande, V. Bromberg, Effects of particle size and surface properties on deposition dynamics of ink-jet-printed colloidal drops for printable photovoltaics fabrication, J. Solar Eng. 132, 021010 (2010).

The invention claimed is:

1. A method of forming sub-micrometer structures, comprising:
    applying to a substrate a structural material and a layer of a sacrificial material;
    maintaining the substrate at a temperature at which the sacrificial material evaporates or sublimes and the structural material is mobilized; and
    permitting the sacrificial material to progressively evaporate or sublime, thereby diminishing a remaining area of the substrate covered by the sacrificial material; and
    permitting the structural material from parts of the area where the sacrificial material has evaporated or sublimed to agglomerate on the remaining sacrificial material to form a said structure.

2. The method of claim 1, wherein the sacrificial material has a lower surface energy than the structural material.

3. The method of claim 1, further comprising continuing the agglomeration until the sacrificial material covering said area of the substrate disappears, leaving a structure comprising said structural material on said substrate.

4. The method of claim 1, wherein said applying comprises applying one or more discrete portions of said sacrificial material centered on intended locations of said structures.

5. The method of claim 1, wherein said applying comprises applying a continuous layer of said structural material.

6. The method of claim 1, comprising applying said layer of said sacrificial material on said substrate, and applying said layer of said structural material on said sacrificial material, and wherein permitting the sacrificial material to evaporate or sublime comprises permitting the sacrificial material to evaporate or sublime at edges of the layers of said structural and sacrificial materials.

7. The method of claim 6, further comprising applying a layer of a third material on said sacrificial material and applying said layer of structural material on said third material.

8. The method of claim 6, wherein said layer of said structural material is a discontinuous monolayer comprising discrete instances of said structural material, and wherein permitting the sacrificial material to evaporate or sublime comprises permitting the sacrificial material to evaporate or sublime at gaps in the layer of said structural material to form additional said edges.

9. The method of claim 1, wherein said sacrificial material is selected from the group consisting of antimony, arsenic, bismuth, cadmium, lead, silver, tellurium, zinc, CdTe, and $Bi_2Te_3$.

10. The method of claim 1, wherein said structure comprises an alloy of said structural material and said sacrificial material.

* * * * *